United States Patent
Cowburn et al.

(10) Patent No.: US 7,554,835 B2
(45) Date of Patent: Jun. 30, 2009

(54) MEMORY ACCESS

(75) Inventors: Russell Paul Cowburn, London (GB); Dan Allwood, Sheffield (GB)

(73) Assignee: Ingenia Technology Limited, London (GB)

(*) Notice: Subject to any disclaimer, the term of this patent is extended or adjusted under 35 U.S.C. 154(b) by 107 days.

(21) Appl. No.: 11/462,304

(22) Filed: Aug. 3, 2006

(65) Prior Publication Data
US 2007/0047156 A1  Mar. 1, 2007

Related U.S. Application Data

(60) Provisional application No. 60/707,196, filed on Aug. 3, 2005.

(30) Foreign Application Priority Data
Aug. 3, 2005 (GB) ................... 0516003.1

(51) Int. Cl.
G11C 11/00 (2006.01)
(52) U.S. Cl. .................... 365/158; 365/60; 365/173
(58) Field of Classification Search .............. 365/158, 365/49, 60, 63, 48, 55, 171, 173
See application file for complete search history.

(56) References Cited

U.S. PATENT DOCUMENTS 3,445,821 A * 5/1969 Blackwell, Jr. et al. ... 365/49.11
3,696,349 A * 10/1972 Kaske et al. ................. 365/60
5,103,422 A  4/1992 Tokita et al.
7,020,004 B1 * 3/2006 Hurst et al. ................. 365/130

FOREIGN PATENT DOCUMENTS

GB       2403080       12/2004
WO       01/31789 A2    5/2001
WO       03/083874 A1  10/2003

OTHER PUBLICATIONS

International Prelminary Report on Patentability issued in related international application PCT/GB2006/002676, Feb. 19, 2007, 15 pages.

* cited by examiner

*Primary Examiner*—Gene N. Auduong
(74) *Attorney, Agent, or Firm*—McDonnell Boehnen Hulbert & Berghoff LLP

(57) ABSTRACT

A magnetic logic device can comprise a generally planar first substrate for an electrical circuit and a plurality of generally planar second substrates for a magnetic circuit, formed in a stacked arrangement over the first substrate. Each said second substrate can have formed thereon a magnetic circuit and each magnetic circuit can have a plurality of logic elements, a data writing element and a data reading element. The data writing element of each magnetic circuit can correspond in planar positioning to a respective magneto-electrical writing element of the first substrate and the data reading element of each magnetic circuit can correspond in planar positioning to a respective magneto-electrical reading element of the first substrate.

42 Claims, 13 Drawing Sheets

MEMORY ACCESS

This application claims priority to and incorporates by reference U.S. provisional application No. 60/707,196 filed on Aug. 3, 2005, and Great Britain patent application GB 0516003.1 filed on Aug. 3, 2005.

FIELD

The present invention relates to memory access, and in particular but not exclusively to writing data into and reading data from a magnetic logic device.

A wide range of data storage devices have become available in the last few years, employing a large variety of storage media for a large range of applications. Different data storage devices are functionally aimed at different storage requirements. Thus various different technologies for data storage are adapted to some of a variety of optional features such as capacity, write/rewrite-ability, stability/integrity (with or without power), size, robustness, portability and the like.

Known data storage devices include magnetic tape storage, magnetic hard disk storage, and optical disk storage. All offer advantages of good storage capacity and relatively rapid data access, and all can be adapted for writing and re-writing of data. All require moving parts in the form of electromechanical or optical readers. This can limit the extent to which devices incorporating such data storage media can be miniaturised, and limit the use of the device in high-vibration environments. Although in each case the surface medium is the key to data storage, the mechanisms involved require careful control of properties also of any supporting substrate. Thus, such devices have to be of carefully controlled construction. Moreover all require the reader to have access to the surface of the device, which can place limitations on design freedom for the device.

Other known data storage devices include solid state electrical storage such as flash memory. These are typically some form of EEPROM (Electrically Erasable Programmable Read-Only Memory), but these suffer from problems associated with limited write endurance and write latency. In particular, flash memory has a life cycle of up to approximately 1000 write operations before degradation of reliability and performance occurs. Also, the write latency for flash memory is high due to the need to charge a large capacitance for the data storage. Additionally, flash memory has a storage density limit of approximately 40 Mbit/mm$^2$ (approximately 25 Gbit/in$^2$).

SUMMARY OF THE INVENTION

The present invention has been made, at least in part, in consideration of problems and drawbacks of conventional systems.

Viewed from a first aspect, the present invention provides a magnetic storage device operable to store data written from an electrical circuit having no direct physical connection to the magnetic storage circuit.

Viewed from another aspect, the present invention provides a high density solid state magnetic storage device.

Viewed from a further aspect, the present invention provides a magnetic storage device without moving parts.

Viewed from another aspect, the present invention provides a method of writing data into a magnetic storage device using an electrical circuit not physically connected to the magnetic storage device.

Viewed from a further aspect, the present invention provides a magnetic circuit element responsive to a remote electrical field generator to write data into a magnetic circuit.

Viewed from another aspect, the present invention provides a magnetic circuit element operable to enable a remote field sensor to read data from a magnetic circuit.

A magnetic logic device can comprise a generally planar first substrate for an electrical circuit and a plurality of generally planar second substrates for a magnetic circuit, formed in a stacked arrangement over the first substrate. Each said second substrate can have formed thereon a magnetic circuit and each magnetic circuit can have a plurality of logic elements, a data writing element and a data reading element. The data writing element of each magnetic circuit can correspond in planar positioning to a respective magneto-electrical writing element of the first substrate and the data reading element of each magnetic circuit can correspond in planar positioning to a respective magneto-electrical reading element of the first substrate. Thereby a multi-layer magnetic logic device can be written to and read from without electrical connection between the magnetic circuit and associated electrical read and write circuitry.

In some embodiments the magnetic logic elements comprise at least one data storage element. Thus a magnetic circuit can be used for data storage.

In some embodiments, the second substrates are separated by a non-ferromagnectic layer. The non-ferromagnetic layer can comprise a material selected from the group comprising a dielectric material, a polymer material and a non-ferromagnetic metal material. Thus interference between circuits on different substrate layers can be avoided.

In some embodiments, each said second substrate can have formed thereon a plurality of magnetic circuits. Thus a high density of circuitry can be achieved.

In some embodiments, the magnetic circuit is formed from nanowires of magnetic material. Each logic element can be formed from a join between nanowires, its function being defined by the geometry of the join. Thus a single magnetic material can be used to cerate a variety of circuits elements, each having a function defined by the shape of the elements.

In some embodiments, the data writing element and the data reading element are a physical single element. Thus a compact magnetic circuit can be provided.

In some embodiments, the magnetic logic device can further comprise a magnetic field generator for generating a rotating magnetic field for driving the magnetic circuits. In some embodiments, the magnetic field generator can be operable to generate a magnetic field in a clockwise and/or an anti-clockwise direction. Thus data held in the magnetic circuits can be propagated in a convenient manner to allow for easy data positioning within the circuit.

In some embodiments, the data writing element can comprise an enlarged stub end of a logical NOT gate. In some embodiments, the data writing element can comprise a circuit portion with a coercivity lower than that of an adjacent circuit portion. The circuit portion with a coercivity lower than that of an adjacent circuit portion can be formed having a different geometry to the adjacent circuit portion. Thus the entire magnetic circuit can be made from a single magnetic material, with the function thereof created by altered geometry.

In some embodiments, the magnetic circuit can comprise an erasure portion. In some embodiments, the erasure portion corresponds in planar positioning to a respective electrical erasing portion of the first substrate. Thus remote erasure can be carried out using a dedicated erasure system.

In some embodiments, the writing portion and reading portion of a magnetic circuit in a first second substrate are offset from the writing portion and reading portion of a magnetic circuit in a second second substrate. Thus interference between circuits in different magnetic circuit layers can be avoided.

A data storage device can be provided comprising a magnetic logic device as described above.

Viewed from another aspect, the present invention can provide a magnetic circuit device. The device can comprise a plurality of generally planar substrates formed in a stacked arrangement, each said substrate having formed thereon a magnetic circuit. Each magnetic circuit can have a plurality of logic elements, a data writing element and a data reading element. The data writing element of each magnetic circuit can correspond in planar positioning to an anticipated position of a respective magneto-electrical writing element and the data reading element of each magnetic circuit can correspond in planar positioning to an anticipated position of a respective magneto-electrical reading element. Thereby a multi-layer magnetic circuit device can be written to and read from without electrical connection between the magnetic circuit and associated electrical read and write circuitry.

Viewed from another aspect, the invention can provide a method for manufacturing a magnetic logic device. The method can comprise forming an electrical circuit on a first substrate, the electrical circuit comprising a plurality of magneto-electric writing elements and reading elements; and forming a plurality of generally planar second substrates in a stacked arrangement over the first substrate, each said second substrate having formed thereon a magnetic circuit. Each magnetic circuit can comprise a plurality of logic elements, a data writing element and a data reading element. The data writing element of each magnetic circuit can correspond in planar positioning to a respective magneto-electrical writing element of the first substrate and the data reading element of each magnetic circuit can correspond in planar positioning to a respective magneto-electrical reading element of the first substrate.

Viewed from another aspect, the present invention can provide a method for manufacturing a magnetic logic device. The method can comprise forming a first device portion comprising an electrical circuit on a first substrate, the electrical circuit comprising a plurality of magneto-electric writing elements and reading elements; forming a second device portion comprising a plurality of generally planar second substrates in a stacked arrangement over a third substrate, each said second substrate having formed thereon a magnetic circuit comprising plurality of logic elements, a data writing element and a data reading element; and attaching the first and second device portions such that the second substrates are arranged between the first and third substrates, and such that the data writing element of each magnetic circuit corresponds in planar positioning to a respective magneto-electrical writing element of the first substrate and the data reading element of each magnetic circuit corresponds in planar positioning to a respective magneto-electrical reading element of the first substrate.

Viewed from a further aspect, the present invention can provide a method for writing data to a magnetic circuit. The method can comprise locating the magnetic circuit in a rotating magnetic field and modulating the rotating magnetic field in at least the location of a data writing element of the magnetic circuit. In some embodiments, the data writing element can comprise a circuit portion with a coercivity lower than that of an adjacent circuit portion. In some embodiments, the magnetic circuit is not electrically connected to a source of the field modulation. Thus a magnetic circuit can be written to using an electrically simple physical arrangement which is simple to manufacture yet provide high performance and data density.

The inventors of the present invention have developed a magnetic logic architecture referred to as 'domain wall logic' which uses no transistors and exhibits very little heating due to data switching. A domain wall is a mobile interface between regions of oppositely-aligned magnetisation. In particular, a sub-micrometer planar nanowire made from a soft magnetic material such as Permalloy ($Ni_{80}Fe_{20}$) has been shown to form an excellent conduit for domain walls (21-23). The high shape anisotropy of the nanowire ensures that magnetisation prefers to align with the long axis of the wire. These two possible directions form the basis of the binary information representation, with a magnetic domain wall acting as the transition edge in a changing signal. Domain walls can be propagated through complex networks of nanowires under the action of an externally applied magnetic field. This field rotates in the plane of the device and acts as both clock and power supply. Previous work has shown how a cusp-shaped planar nanowire can be used to reverse the direction of magnetisation. In order to provide a consisted reference, in the following a logical '1' is defined as the magnetisation pointing in the direction of propagation of domain walls and a logical '0' as the magnetisation opposing the direction of propagation of domain walls. Thus a cusp in effect performs the logical NOT operation. Thereby, a data storage function can be effected.

In order to implement an arbitrary logic function, it is necessary to have some additional basis functions. The addition of at least one 2-input function, such as AND or OR, to complement the NOT function allows any computational calculation to be performed. Two routing functions are also required for most complex logic circuits: a fan-out structure which makes two identical copies of an input signal and a cross-over structure which allows two signals to pass over each other without interference. In the context of the present magnetic circuit constructs, it is also necessary that the applied magnetic field requirements of the functions should be mutually compatible, so that a single global rotating magnetic field can be applied to the entire circuit, with all of the different functions operating together. It has been found that this can be achieved for an architecture consisting of logical NOT, logical AND, fan-out and cross-over junctions. Furthermore, a field-addressable data input element for providing logic circuits with data to operate on has been developed and added to the above list of components to allow data to be written to and read from the magnetic circuits from a related electronic circuit.

Particular and preferred aspects and embodiments are also set out in the appended claims.

BRIEF DESCRIPTION OF THE FIGURES

Specific embodiments of the present invention will now be described by way of example only with reference to the accompanying figures in which.

Figure 1:
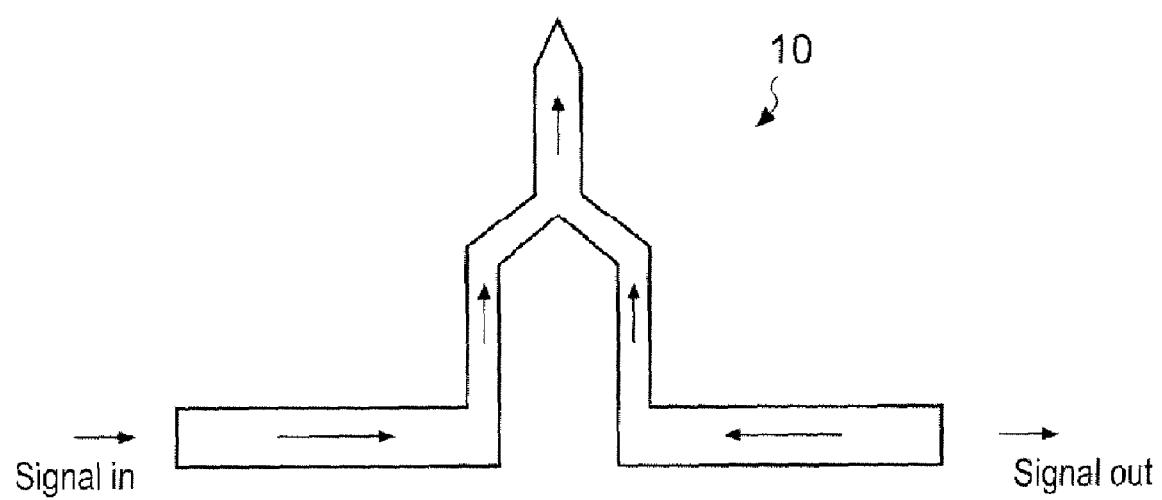
FIG. 1 shows a schematic representation of a magnetic circuit element providing logical functionality equivalent to a NOT gate.

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the spirit and scope of the present invention as defined by the appended claims.

DESCRIPTION OF PARTICULAR EMBODIMENTS

Digital microelectronics is a combination of memory and logic. The basic Boolean logic functions such as AND, NOT, XOR allow the digital IC to combine numbers from memory in arithmetic calculations. MRAM is manufactured using a CMOS-compatible process and will, therefore, indirectly impact microelectronic logic by allowing large amounts of high-speed high-density non-volatile memory to be embedded with the semiconductor microprocessor. The emerging field of magnetic logic seeks to redesign the principles of operation of microelectronic logic at the lowest level to make direct use of ferromagnetism.

Attempts have been made (see R. P. Cowbum, M. E. Welland, *Science* 287, 1466 (2000), G. Csaba, W. Porod, A. I. Csurgay, *Int. J. Circ. Theor. Appl.* 31, 67 (2003), and A. Imre, G. Csaba, V. Metlushko, G. H. Bernstein, W. Porod, *Physica F* 19, 240 (2003)) to implement magnetic logic based upon a single electron transistor architecture designed by the University of Notre Dame (J. Amlani etal, *Science* 284, 289 (1999)). These schemes, called magnetic cellular automata, use a network of magnetostatically coupled magnetic elements. Information propagates by magnetic solitons running across the lattice of interacting magnetic elements, and logic functions are performed by summing stray magnetic fields at nodal dots that have well defined switching thresholds. One of the challenges with such schemes is that the magnetostatic interaction field between ferromagnetic elements is usually weaker than the demagnetising field within the element; consequently, any physical defects in the shape of the magnetic elements tend to block the propagation of information and the device becomes excessively intolerant to fabrication faults.

A number of MTJ-based magnetic logic schemes have been proposed. In one class of these (see G. Reiss et al., *Phys. Stat. Sol. A* 291, 1628 (2004), A. Ney, C. Pampuch, R. Koch, K. H. Ploog, *Nature* 425,485 (2003), and R. Richter et al., *Solid-State Electron.* 46, 639 (2002)), information enters into the logic gate via the currents in multiple bit lines. The so-called 'free layer' of the MTJ will rotate into the direction of the net magnetic field from the combined currents, effectively acting as a non-linear summing element. This in turn changes the resistance of the junction, which can be used to control the current in subsequent bit lines. Such a scheme has a number of advantages, not least that the devices are based upon existing MTJ technology and that the logic function can be programmed by changing the magnetisation direction of the reference layer in the magnetic tunnel junction. This makes them attractive for Field Programmable Gate Arrays (FPGAs) (see Z. Navabi, *Digital Design and Implementation with Field Programmable Devices* (Kluwer Academic Publishers, 2005)), where many different applications use the same hardware; the precise hardware function is defined by programming a configuration of the storage elements. Perhaps even more appealing is the prospect of on-the-fly reconfigurability, since the function-defining magnetic hard layer can be reversed in nanoseconds, allowing hardware to adaptively track the optimised architecture for the computation in hand (G. A. Prinz, *Science* 282, 1660 (1998)). A disadvantage of these schemes is that high current densities must be switched every time the data changes, which requires high magneto-resistance ratios and large transistors. A variation on this theme exists in which a MTJ is used to bias a conventional electronic logic gate (W. C. Black, B. Das, *J. Appl. Phys.* 87, 6674 (2000)). In this case, the MTJ is only used to define the logic function; the actual computation is performed entirely in classical electronics.

Conventional microelectronic integrated circuits (ICs) work by controlling the flow of electrons through transistor switches. Digital signals are represented in the IC by the presence or absence of electrical charge. Electrons can offer more, however. In addition to electrical charge, electrons also possess the quantum mechanical property of spin. Unlike electrical charge, however, spin can have two directions, conventionally known as 'up' and 'down', permitting alternative representations of binary digits. For example, the magnetization of a small ferromagnetic element is the classical limit of electron spin and has long been used to store information in magnetic recording. During the past decade, a number of researchers have been building the new technology of spintronics, in which the spin as well as the charge of the electron is used in microelectronic ICs to represent bits and carry out data processing. This in general promises lower powered, higher speed, non-volatile, devices with which to build the next generation of computing technology.

Spintronics development has followed different approaches in the semiconductor and magnetism communities. The semiconductor approach involves creating and manipulating spin-polarised electrons in a semiconductor host, with information being represented as either spin 'up' or spin 'down'. At the current time, the lack of a suitable room temperature ferromagnetic semiconductor has limited the development of functioning devices, although much progress has been made in understanding the manipulation of spin in semiconductors using optical probes.

The magnetism approach to spintronics has followed a different path. Following the discovery of giant magnetoresistance exhibited by metallic ferromagnetic/non-magnetic multilayers (see M. N. Baibich et al., *Phys. Rev. Lett.* 61, 2472 (1988)), researchers have developed a large number of room temperature devices by using ferromagnetic metals such as nickel, iron and cobalt. Information is represented in these devices by the direction of magnetisation in a small ferromagnetic element. One such device, called a magnetic tunnel junction (MTJ) forms the building block of Magnetic Random Access Memory (MRAM), a non-volatile, high-density, high-speed memory technology (see G. Grynkenich et al., *MRS Bulletin* 29, 818 (2004)). Furthermore, recent demonstrations of the spin momentum transfer effect (see J. C. Slonczewski, *J. Magn. Magn. Mater.* 159, L1 (1996), L. Berger, *Phys. Rev. B* 54, 9353 (1996), J. A. Katine, F. J. Albert, R. A. Buhrman, E. B. Myers, D. C. Ralph, *Phys. Rev. Lett.* 84, 3149 (2000), S. J. Kiselev et al., *Nature* 425, 380 (2003), and W. H. Rippard, M. R. Pufall, S. Kaka, S. E. Russek, T. J. Silva, *Phys. Rev. Lett.*), in which magnetisation is operated on directly by an applied current, have added further heat to this already exciting field by providing a new interface mechanism between the worlds of electronics and magnetism. The inventors of the present invention have been working to extend magnetic non-volatile memory to develop the required elements for viable magnetic logic technologies.

Thus it is apparent that the field of spintronics, in which both the spin and charge of electrons are used for logic and memory operation, can provide logic devices using a technological base different to that of traditional semiconductor electronics. Using these techniques, a complete logic architecture can be constructed using planar magnetic wires less than a micrometer in width. Logical NOT, logical AND, signal fan-out and signal cross-over elements can all be constructed having a simple geometric design and can be used together in a single circuit. An additional element for data input allows information to be written to magnetic domain wall logic circuits.

The technology of using so-called nanomagnets to form so-called magnetic quantum cellular autonoma (MQCA) devices was discussed in Cowburn and Welland, Science Vol 287 pp 1466-1468. Making use of such techniques, magnetic circuit elements and circuits employing such elements have been discussed in international patent applications PCT/GB01/05072 (WO02/41492) and PCT/GB03/01266 (WO03/083874). Thus there is an existing base of knowledge in making magnetic circuit elements, and simple circuits employing these elements based on the disclosure of these papers and patent applications.

In the context of the present examples, one of the circuit elements used in a magnetic memory circuit is the NOT gate, as shown in FIG. 1. The NOT gate 10 of the present example can be constructed from chains of nanometer scale dots of magnetic material, or from nanometer scale planar magnetic wires. The arrows shown in FIG. 1 represent the direction of the magnetic field within the narrow strips of material which form the NOT gate. The basic principal of operation of the NOT gate 10 is that an incoming magnetic field domain wall is propagated through the gate, with a field direction reversal occurring as the domain wall passes through the track patterns. Thus the logical NOT gate fountain is provided by the physical effect of a magnetic field direction inversion.

In use, the gate is placed in a magnetic field, the vector of which rotates in the plane of the device with time. Due to magnetic shape anisotropy, the magnetisation in the wire is generally confined to lie in along the long axis of the wire. Thus in most cases, two magnetisation possibilities exist, enabling a traditional binary representation of data to be effected. A change in magnetisation direction within the wires is mediated by a magnetic domain wall, which can be swept along the wires by the applied field. The fact that the field rotates means that the domain walls can be carried around corners.

Further details of the operation and construction of the NOT gate 10 are presented in WO03/083874 (Cowburn), the entire content of which is hereby incorporated hereinto by reference) and thus will not discussed further here. However, the basic principles of the operation of the NOT gate are clear.

Figure 2:
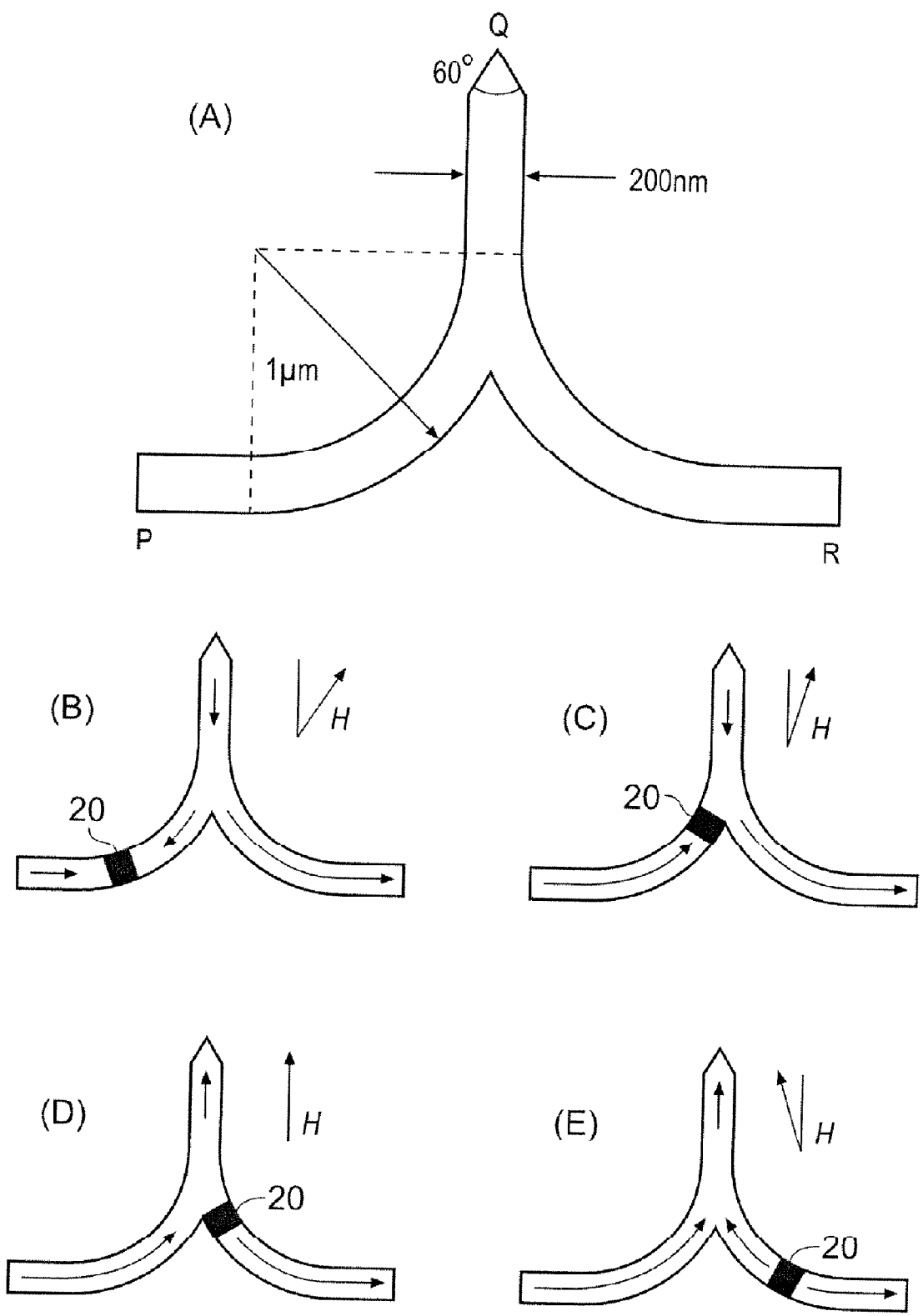
FIG. 2 shows a schematic representation of the movement of domain walls through a magnetic NOT gate.

In the following examples, a NOT gate similar to that shown in FIG. 1 can be used to construct single- or multi-bit memory circuits. The NOT gates used in these circuits have a cycloidal shape. The gate can be made by focused ion beam milling of a 5 nm thick Permalloy($Ni_{80}Fe_{20}$) film on a silicon substrate. FIG. 2 gives an explanation of the inverting action of the cycloid and shows how a delay of one half cycle occurs between the input changing state and the output changing state Under low magnetic field conditions, the magnetisation direction within sub-micron ferromagnetic planar wires tends to lie along the wire long-axis due to strong magnetic shape anisotropy. When two oppositely directed magnetisation meet within a wire, the re-alignment of successive atomic magnetic moments is not abrupt but occurs gradually over a certain distance to form a domain wall.

It is now known that domain walls can propagate along straight sub-micron magnetic wires by application of a magnetic field parallel to the wire. In the present examples, a magnetic field can be applied with a vector that rotates with time in the sample plane to propagate domain walls along magnetic wires that also change direction and turn corners. The clockwise or counter-clockwise rotation defines the magnetic field chirality. A domain wall should propagate around a magnetic wire corner providing that the field and corner are of the same chirality. However, the chirality of a corner depends upon the direction of domain wall propagation so that, within a rotating magnetic field of given chirality, a domain wall will only be able to pass through a given corner in one direction. This satisfies the important requirement of any logic systems that a definite signal flow direction must exist. The two stable magnetisation directions within sub-micron magnetic wires provide a natural means of representing the two Boolean logic states and this, together with application of a rotating magnetic field, is the basis of operation of each logical unit of the memory device.

The cycloid illustrated in FIG. 2 provides an inverting function and demonstrates NOT-gate functionality when within a suitable rotating magnetic field. Suppose the magnetic field is rotating in a counter-clockwise sense. A domain wall 20 arriving at terminal 'P' (see FIG. 3B) of the junction will propagate around the first corner of the junction (see FIG. 3C) and through to terminal 'Q' as the applied field rotates from the horizontal to the vertical direction. The magnetisation between 'P' and 'Q' will now be continuous (see FIG. 3D). Then, as the magnetic field vector continues to rotate towards the opposite horizontal direction, the domain wall 20 should propagate around the second corner of the junction (see FIG. 3E), exiting at terminal 'R' and restoring continuous magnetisation between 'Q' and 'R'. The magnetisation of the wire immediately after the junction should now be reversed compared with that immediately before the junction. The junction should therefore perform the desired NOT-function with a half field-cycle propagation delay. This operation is analogous to a car reversing its direction by performing a three-point turn.

There is thus a half-cycle total delay between the wall arriving at the input and leaving from the output. In the following examples, the memory function associated with this synchronous delay is exploited by connecting a large number of magnetic NOT gates together in series and then piping the output of the chain back to the input.

Figure 3A:
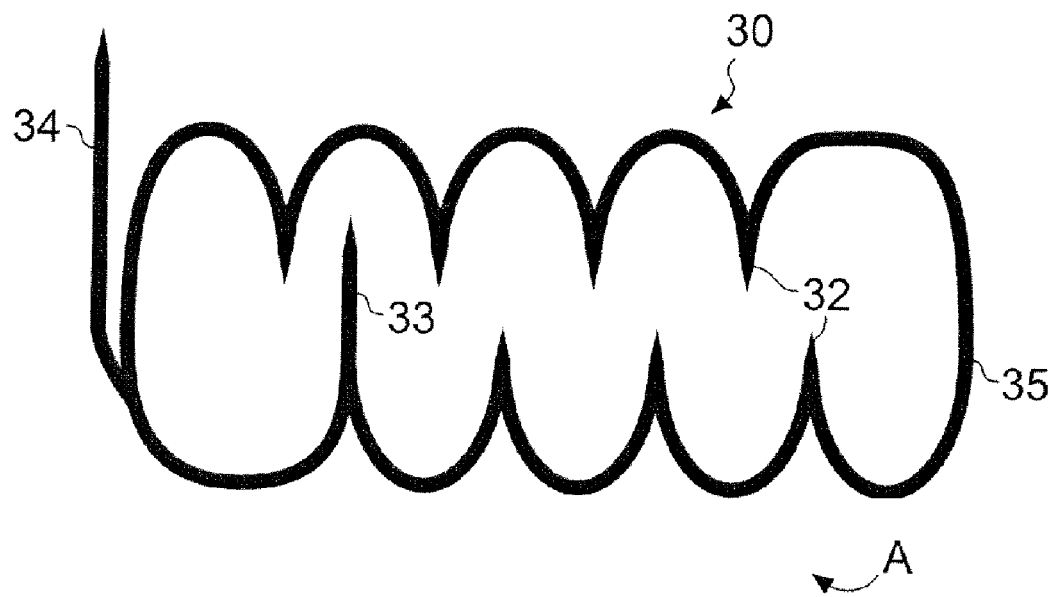
FIGS. 3A and 3B show schematic representations of magnetic memory circuits having different configurations.

As shown in FIG. 3A, a number of these cycloidal cusps can be connected together to create a multi-element, functionally circular, shift register 30. By applying a rotating magnetic field in the direction A to the whole of the shift register 30, domain walls within the shift register 30 will be driven around the shift register in the direction of rotation of the magnetic field. Thus the shift register 30 of the present example includes a number of cycloidal cusps 32 connected in a loop. The shift register 30 can also include a data entry element 33 and a data reading element 34 each of which will be discussed in greater detail below.

As discussed above, the data loops sit in a magnetic field, the vector of which rotates in the plane of the loops with time. In the present example this rotation has a frequency in the range 1 Hz-200 MHz. The field magnitude may be constant as the field rotates, thus forming a circular locus for the magnetic field vector, or it may vary, thus forming an elliptical locus for the magnetic field vector. This can be achieved in small area devices by placing an electromagnetic strip line underneath the loops and then passing an alternating current through the strip line. In larger area device, the substrate carrying the loops is placed within a quadrapole electromagnet.

The field magnitude should be strong enough to ensure that a domain wall can be pushed all the way through each NOT gate, but not so strong that new domain walls can be nucleated independently of the data input mechanism.

The field required to push a domain wall through each NOT gate can be tuned by varying the thickness of the loops, the width of the loops and the magnetic material used to make the loops. This field should be large enough that the device does not suffer erasure from stray ambient magnetic fields. The invention may be shielded using MuMetal if stray field erasure is a problem. In one set of examples, optimum applied field strengths in the range of 50-200 Oe (3980-15920 A/m) may be used.

Figure 3B:
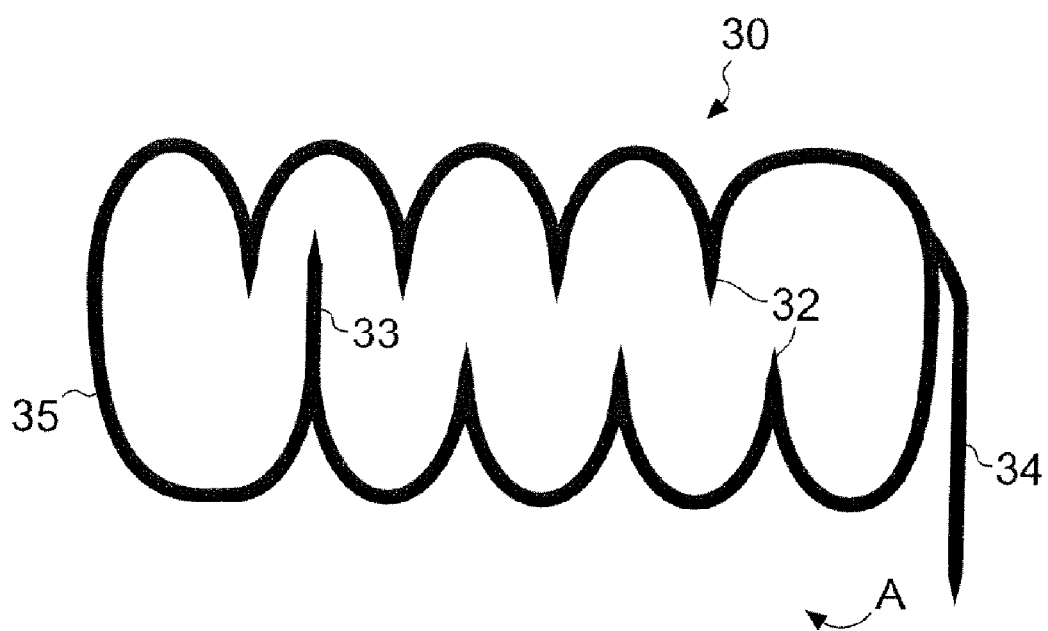

An alternative arrangement of the relative positions of data entry element 33 and data reading element 34 about the shift register is shown in FIG. 3B. Many such alternative configurations can be produced, as the governing principle behind the location of the circuit elements is the handedness of the elements, such that all operate co-operatively together in the single rotating magnetic field.

In the circuits of the present examples, one data bit is stored by two circuit elements. Each circuit element has a half-cycle delay in transferring a domain wall from the start of the circuit element to the output of the circuit element. This memory effect enables the data storage by the cirucit. In the context of FIGS. 3A and 3B, each of the NOT gates 32 (including the data writing element 33), the fan-out junction for the read-out element 34, and the plain end opposite the fan-out junction are each considered as circuit elements. Thus the circuits illustrated in each of FIGS. 3A and 3B are 5 bit (10 circuit element) shift registers.

It is possible and practicable to create a magnetic circuit of this type with an odd number of circuit elements. However it should be noted that, in such a circuit, each data bit is inverted by each complete rotation of the bit around the circuit. Thus, it can, in some applications, be necessary to track whether the circuit is operating on an "even" or an "odd" cycle at any given time to avoid data inversion causing corruption of loss after reading of the data. With an even number of circuit elements, no such data inversion occurs such that the cycle tracking is unnecessary.

Figure 4:
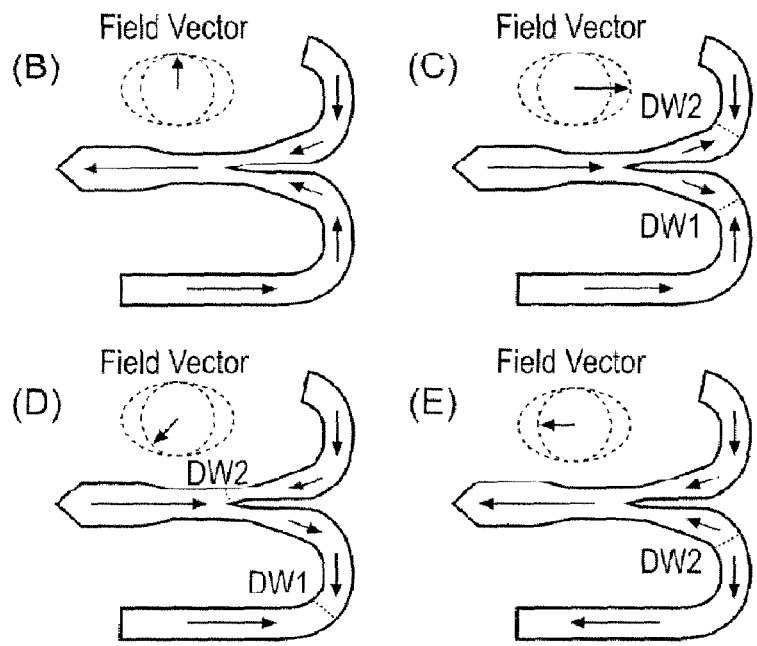
FIGS. 4A to 4G show the operation of a writing element in a magnetic memory circuit.
Figure 4:
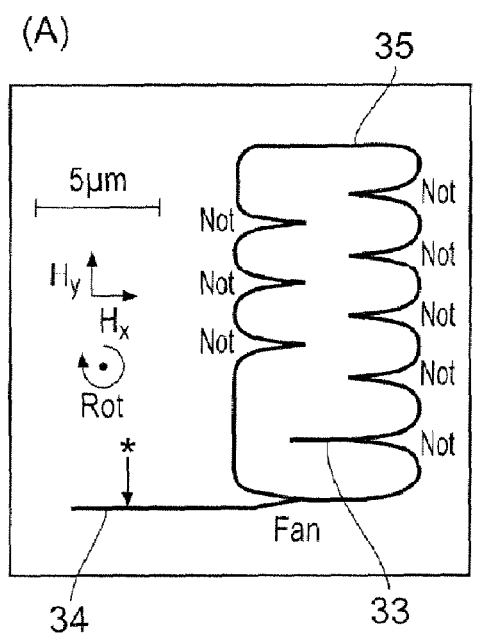
Figure 4:
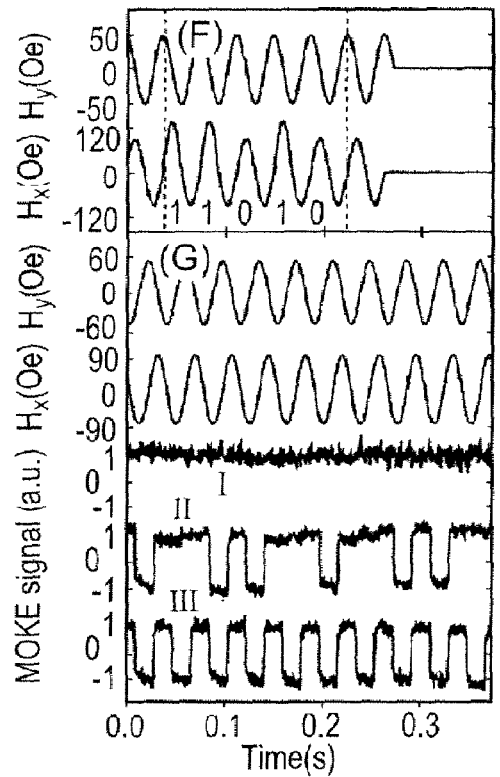

A more detailed discussion at the operation of a shift register, including the operation of the data writing element 34, will now be presented with reference to FIGS. 4. In this figure, an example is given of a simple circuit, constructed on a nanometer scale. The directions of field components, Hx and Hy, the sense of field rotation (Rot) and the position of MOKE measurement (*) are indicated in the Figure.

In the following, the terms "horizontal" and "vertical", when used of field amplitudes, refer to the field strengths in the x and y directions on the Figures as viewed respectively. There is no requirement for circuits to be held in a particular ordinal orientation in order to be used successfully.

As the skilled reader will appreciate, a circuit which is to be put to use storing or processing data, must be able to receive data from the outside world. FIG. 4A shows a 5-bit magnetic circular shift register structure containing eight NOT-gates and a fan-out junction. In this circuit, one of the NOT-gates has an enlarged central stub region to lower the coercivity of the wire so as to reduce the necessary strength of an applied magnetic field to cause magnetisation reversal thus making this a data-input element 33. The stray magnetic field from a current-carrying conductor could be used to write magnetic data directly and locally into the enlarged stub. However, in the present example the stub is designed such that field amplitudes required to write data to it lie within the operation range of the other NOT-gates and fan-out junction. It is therefore possible to write data by modulating the amplitude of the globally applied rotating magnetic field. The rotating field thus acts simultaneously as power supply, clock, and serial data channel.

FIGS. 4B-E shows the operating principle of a data-input element within a clockwise rotating field. From the initial magnetisation state (FIG. 4B), a large amplitude field $H_x^{write}$ nucleates a domain wall in the element that propagates through the NOT-gate junction and divides into domain walls DW1 and DW2 along the input/output wires (FIG. 4C). Domain wall DW1 is routed around a corner of the same handedness as the applied field rotation and will continue to propagate around the shift register (FIG. 4D). In contrast, domain wall DW2 is initially routed around a corner of opposite handedness to the applied field rotation and so, as the field rotates further, the domain wall must reverse its direction and pass back through the NOT-gate (FIG. 4D). At the NOT-gate, the returning domain wall must again split into two. One part will propagate along what is the output arm of the NOT-gate junction (FIG. 3E), following the original domain wall with a half-cycle delay, while another part will propagate back along the data-input element to restore the initial magnetisation state (FIG. 4E). in order to prevent a potentially disruptive oscillation condition, the element 33 is designed such that this returning domain wall annihilate upon reaching the element end. The output of the data-input element 33 from this field sequence with a single nucleation event is, therefore, a pair of domain walls.

Figure 5:
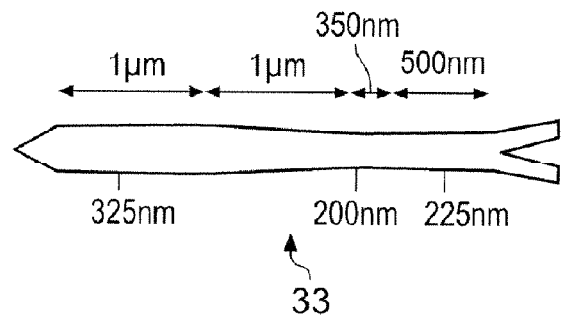
FIG. 5 shows writing element for a magnetic memory circuit.

As shown in FIG. 5, the writing element 33 as used in the example circuit depicted in FIG. 4A can have physical dimensions selected to cause the required reduction in reversal field strength relative to the remaining elements of the circuit, as well as the desired characteristic of annihilating domain walls which reach the stub end. In this example, the entire element has a total length of approximately 3 micrometers from the junction of the incoming and outgoing signal paths to the stub end. This is divided into an initial portion, having a length of 225 nm and a lengthh of 500 nm, followed by a narrowed portion with a width of 200 nm and a length of 350 nm, followed by a broadening portion 1 μm long and reaching a width of 325 nm. Next another 1 μm long portion maintains the width of 325 nm, and finally the stub end is formed as a blunt point approximately 300 nm long. These physical dimensions have been shown to work in the circuit illustrated in FIG. 4A where the magnetic wires have a width of 200 nm and all corners have a 1 µm radius of curvature.

Reading data from the shift register is a matter of aligning a magnetic field sensor with the fan-out reading element 34. As each domain wall is driven around the circuit by the rotating magnetic field, as that domain wall passes through the fan-out, that domain wall splits into two, with one continuing around the circuit, and the other passing into the reading element 34. This the magnetic field direction within the read element 34 is the same as the field direction in the corresponding portion of the circuit. As with the writing element 33, the stub end of the read element is shaped sop as to annihilate the domain walls in order to prevent a disruptive oscillation condition from occurring.

Writing of data to the shift register is performed using the applied signals shown in FIG. 4F. The 5-bit sequence example write field pattern is applied once to fill the shift register with the 5-bits of data, with only the section between the dotted lines performing data writing (the final field cycle is used to ensure all domain walls correctly enter the shift register loop). Prior to the writing process, all domain walls are annihilated by applying a low-amplitude rotating field. For writing a single data bit in the circuit of the present example, the amplitude components of one half-cycle of field are $H_x^{write}$=138 Oe (10984.8 A/m) and $H_y^0$=50 Oe (3980 A/m), causing the magnetic data-input element to switch as described above. The field conditions for not writing data are $H_x^{no-write}$=90 Oe (7164 A/m) and $H_y^0$=50 Oe (3980 A/m). MOKE (Magneto Optic Kerr Effect) measurement with $H_x^0$=90 Oe (7164 A/m) and $H_y^0$=50 Oe (3980 A/m) of the shift register in its initialised configuration verifies that no domain walls are present (FIG. 3G, trace I). After a single application of the write field pattern, the shift register contains several two domain wall packets that represent a binary data stream of '11010' (FIG. 3G, trace II). Note that in this case a low MOKE signal corresponds to logical '1', due to the 180° turn between the input element and the read-out wire. This data stream corresponds perfectly to the data stream in the write field pattern (FIG. 4F) and confirms the principle of data-input element operation described above.

Under experimental conditions, a delay of one hour between writing and reading returned the correct bit sequence, demonstrating the intrinsic non-volatility of the shift register. However, the ultimate room temperature storage time in fact far exceeds one hour, and wire width and thickness can be engineered to ensure that data retention times exceed 10 years. All information within the entire shift register can be removed by application of a single bulk erase half-sinusoid field pulse of amplitude $H_x^0$=243 Oe (19342.8 A/m) and 1.85 ms pulse length, immediately filling the shift register with ten domain walls (FIG. 4G, trace III) regardless of the initial magnetisation arrangement.

Thus there has now been described an example of a fully workable and usable magnetic circuit shift register, which by selective application of an altered magnetic drive signal can be written to for storage of data therein. The data can be read out by a magnetic field sensor aligned with a provided signal carrying element. This circuit can be contracted or extended by removal or addition of NOT functions to hold any number of data bits. An interface between the magnetic storage circuit and a reading and writing circuit (which may be a traditional electrical circuit) need have no direct physical connections, as these functions are performed using magnetic fields which can be manipulated and sensed indirectly.

Figure 6:
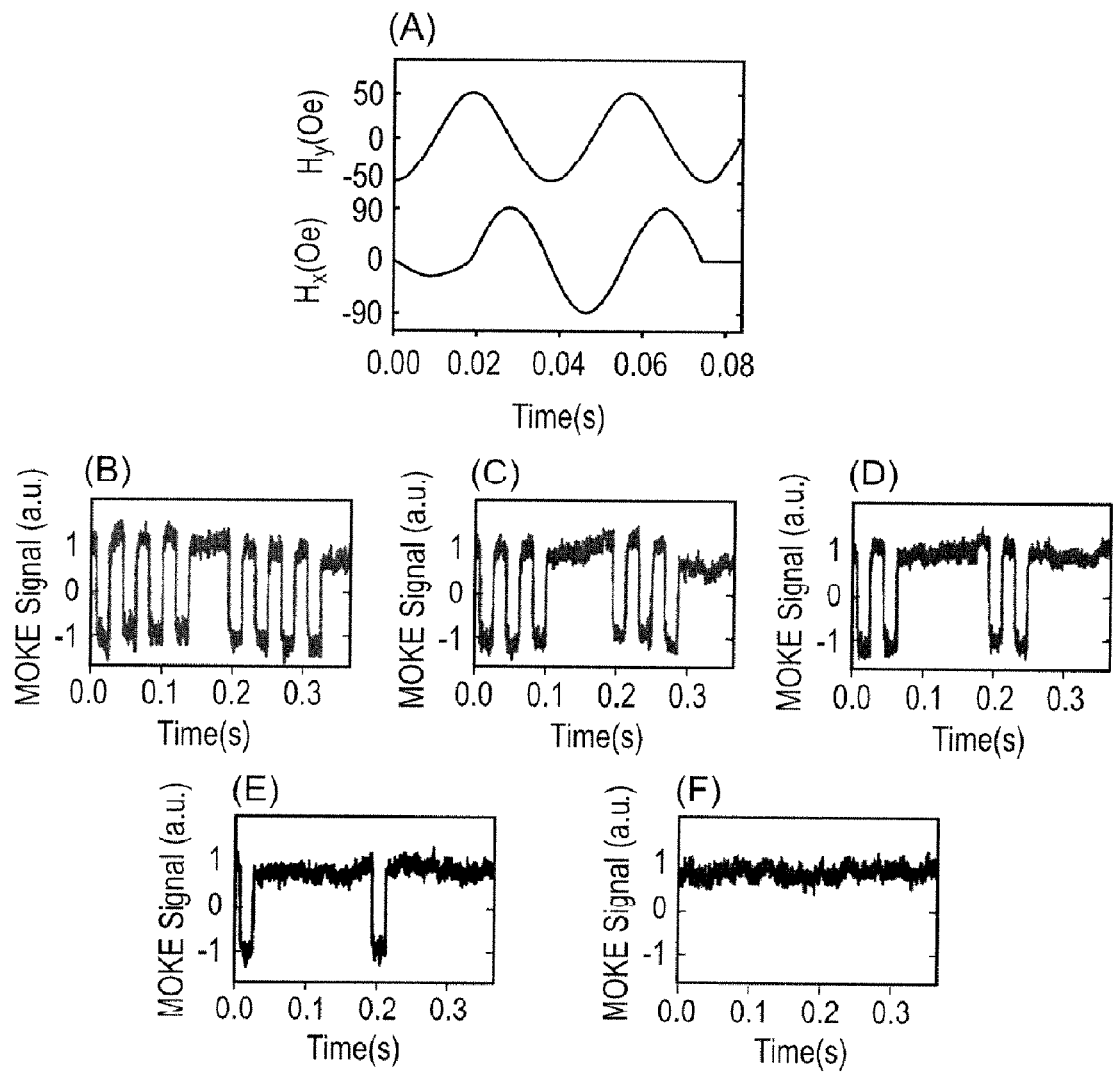
FIGS. 6A to 6F show the operation of a data erase process for a magnetic memory circuit.

In one example, the clear end 35 opposite the fan-out for the data read element 34 can be used for selective data deletion. FIGS. 6A to F illustrate this process with respect to the example shift register described above with reference to FIG. 4. In this example, it is assumed that each data element has been pre-loaded with a domain wall. To carry out the selective deletion, starting from a position where the horizontal field component is zero (such that each NOT gate and the fan-out have a domain wall at their input, and there is also a domain wall on the clear end), the drive field for the circuit is altered during the first half of a cycle so as to cause the domain wall on the clear end to move and to collide with another domain wall and annihilate, thus deleting the information which they previously held. The altered drive field is illustrated in FIG. 6A, which shows a reduced horizontal field amplitude during the first half-period. This reduced amplitude is insufficient to propagate a domain wall through a wire junction, thus all of the domain walls at the NOT gates and the fan-out junction are pinned and do not move. However the amplitude is great enough to propagate the domain wall along the clear end where there is no wire junction to negotiate. This domain wall thus propagates to the next memory element during the first half of the period (when it is the only domain wall to move). During the second half of the period the two domain walls in the same memory element collide and mutually annihilate, thus deleting the data. This is shown in FIG. 6B, where it is clear that one data bit has been deleted.

Continued application of this procedure is shown in FIGS. 6C through F, where in each successive Figure, another domain wall pair have been deleted, thus the data in the shift register has been selectively deleted one bit at a time. As will be appreciated, this deletion can be applied non-sequentially, so that some data bits can be kept and others deleted, irrespective of their relative positions around the shift register.

As domain wall annihilation only occurs in one region of the shift register, domain walls to be deleted must be moved into this region. The second full field cycle of the bit-wise erase field pattern propagates all domain walls by two memory elements with no domain wall annihilation. This "sets-up" the next domain wall pair to be annihilated. If this next pair are not to be annihilated, then a "normal" drive signal can be applied to move that pair past the erasure zone.

As will be appreciated, the deletion of the domain walls should be commenced upon the correct sign of the horizontal drive filed. When the correct sign is used, the annihilated walls are those which describe a stored data bit, thus allowing the data bit to be deleted without affecting any other data in the register. However, if the sign of the horizontal field is incorrect, then the deleted domain walls will be one from each of two stored data bits, thus both such bits will be corrupted but neither completely deleted. To correct this situation, the register can be wiped (i.e. all data deleted) and the data re-written, or new data can be written to the affected positions in the shift register.

This effect can also be created by stopping the drive field for the circuit as a whole, such that the domain walls remain stationary within the circuit. Then a local directional field is created at the clear end so as to move a single domain wall along the clear end. As no other domain walls are in motion at that time, the moved domain wall will collide with a domain wall at the other end of the clear end causing mutual domain wall annihilation and thereby deleting the data held by that domain wall pair. This local magnetic filed application can be applied using a remote field generation process in the same way as for writing of data using the data writing element 33.

Also, in an alternative example, the selective data deletion process outlined above can instead be used for a write process. In this mode of operation, the circuit is pre-loaded with all "1"s and the selective delete can be used to write "0"s where required by moving the data sequence through the circuit using the global magnetic filed, and stopping that field to perform the selective writing of "0" in the required data positions.

As with conventional electrical circuits, multiple magnetic circuits can be formed side-by-side on a single substrate. Each circuit can be individually read from and written to as discussed above. An optimal balance between the number of loops and the number of NOT gates in each loop will be found for a given application. A small number of loops each comprising a large number of NOT gates will be very easy and cheap to integrate into a package but will be prone to failure of the entire device if a single NOT gate fails through manufacturing defects. Such a combination will also have a long data access time, as one must wait a large number of clock cycles on average for a given data block to cycle round to the reading position. A large number of loops each comprising a small number of NOT gates will be very resistant to failure of individual NOT gates (the loop containing the failed gate can be taken out of circuit without significantly reducing the overall storage capacity) and will have a rapid access time, but will involve more reading and writing points (and therefore higher cost and lower data density on the substrate) and it will be more complicated to integrate a large number of loops into a single integrated circuit package. All of the figures in this document show loops of 8 gates. This is purely figurative-in practice each loop may contain any number of gates from only a few to many thousands of gates.

Figure 7:
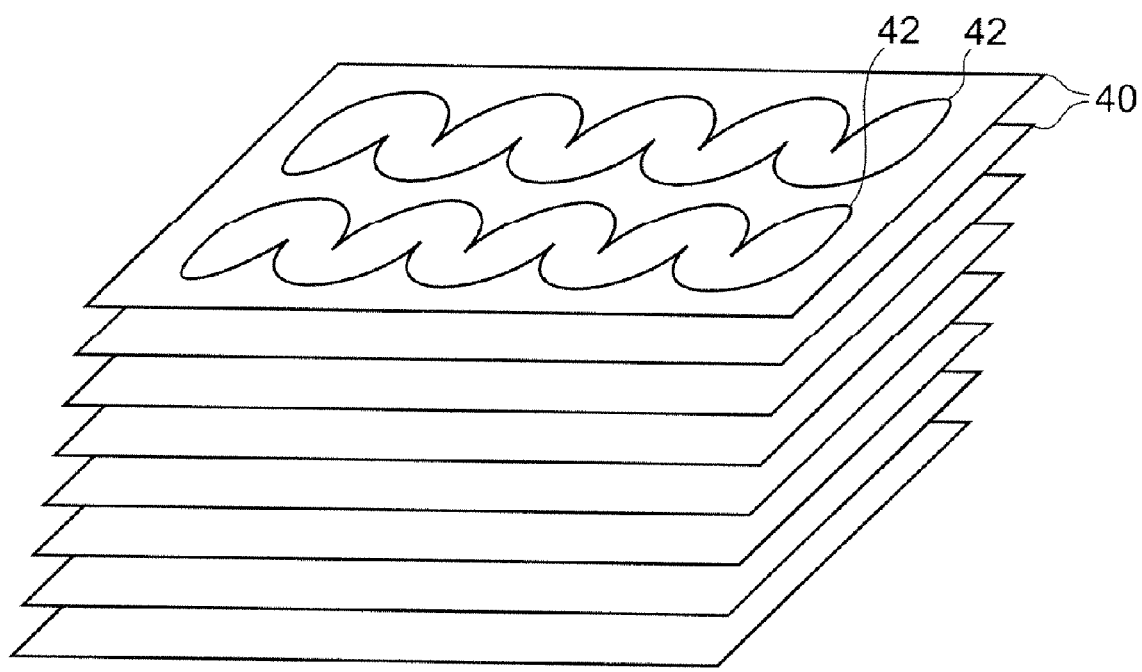
FIG. 7 shows a schematic representation of a multi-layer magnetic circuit device.

In addition to placing multiple circuits on a single layer, the magnetic circuits discussed above can also be formed in multiple layers as shown in FIG. 7. Here a number of substrate layers 40, each having formed thereon one or more magnetic circuits 42 can be manufactured to create a high density magnetic circuit device. In one example, a multi-layer device can be formed by depositing each substrate layer, and creating the circuit(s) for each layer in turn before depositing a next substrate. A layer of material can be deposited between the circuit-bearing substrate layers to separate the magnetic circuits in the different layers. In one example, this material spacing provides an inter-layer spacing of approximately 20 nm to prevent magnetostatic coupling between circuits on the different layers. The material for separating the layers can be any non-ferromagnetic material. Examples of suitable materials can include dielectric materials, polymer materials and non-ferromagnetic metals. In some examples, the separation material is a material which can be easily deposited during a layer-based fabrication process.

Figure 8:
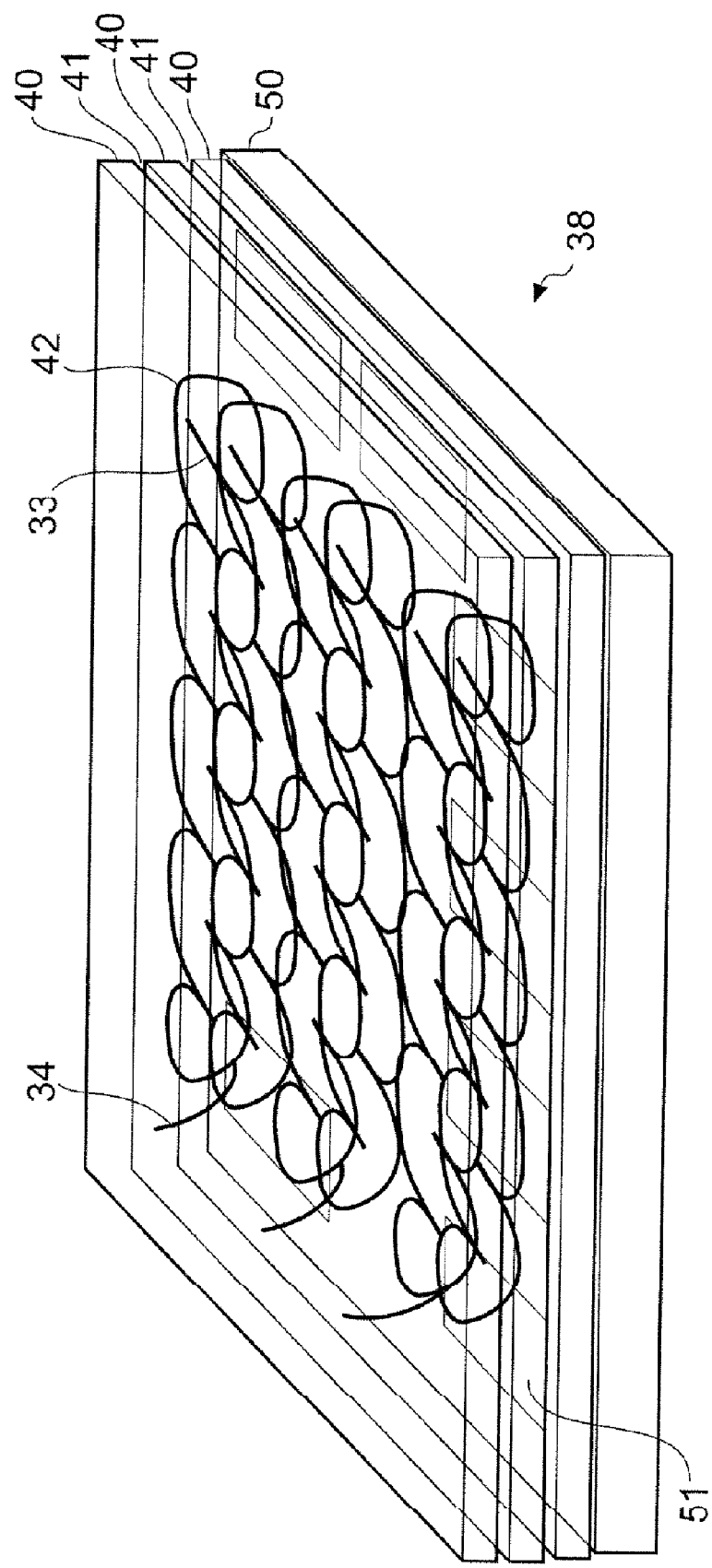
FIG. 8 shows a schematic perspective representation of a multi-layer magnetic circuit device.

Referring now to FIG. 8, there is shown an example of a multi-layer magnetic device formed over a single layer of electrical circuit system (such as a CMOS circuit) which provides reading and writing functionality to the magnetic circuits in all the layers of the device.

Figure 9:
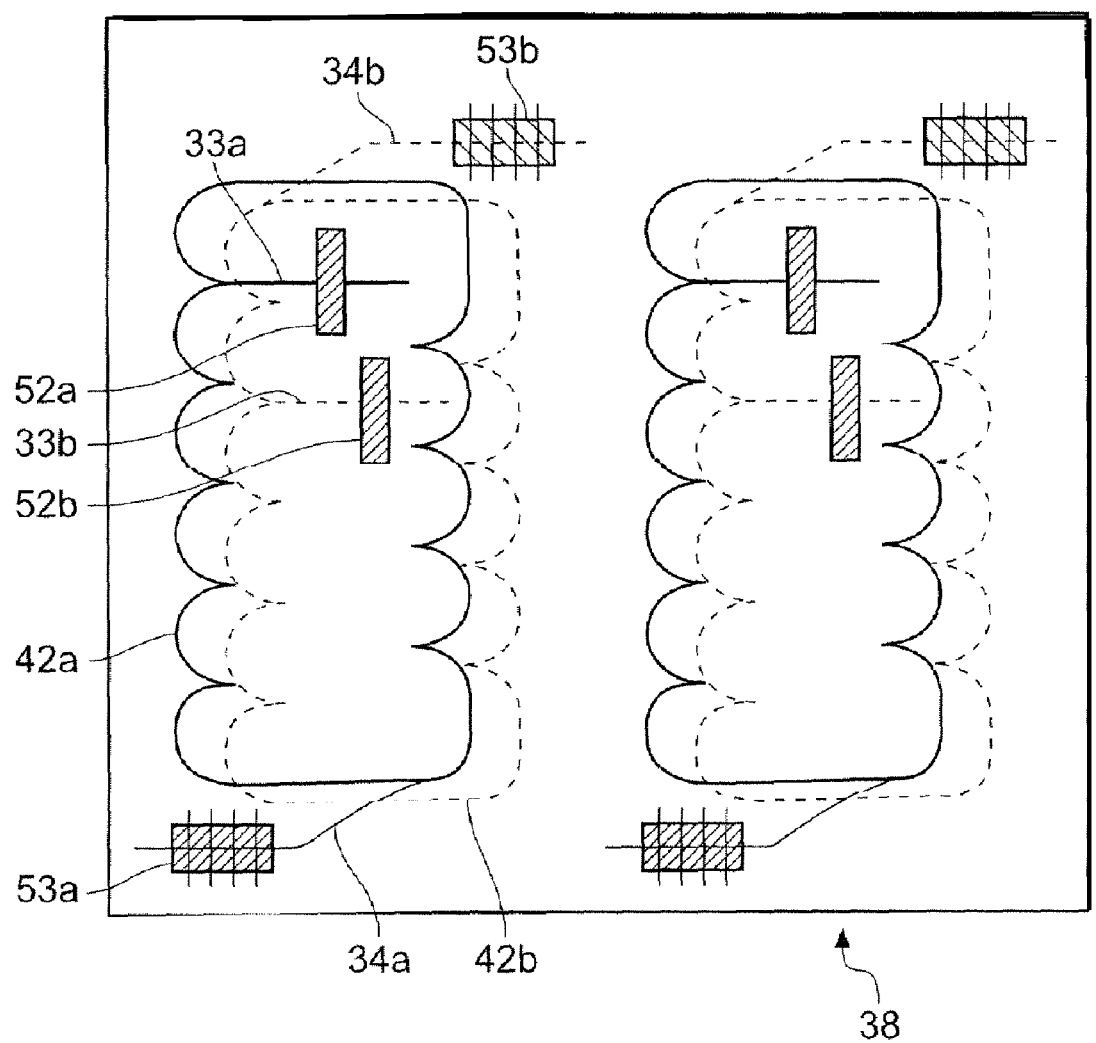
FIG. 9 shows a schematic plan view of a multi-layer magnetic circuit device.

As shown in FIG. 9, a silicon substrate 50 can have formed thereon a number of electrical circuit elements 51. These can take the form of elements designed to create a magnetic field which extends beyond the plane of the substrate 50, and magnetic field sensors designed to detect a magnetic field outside of the plane of the substrate 50.

In order to avoid a magnetic field generator for a given circuit writing to another circuit, it is necessary to offset the generators and corresponding data writing elements for different circuits. Likewise, in order to avoid magnetic field sensors reading data from the data read out element of the wrong circuit, it is necessary to offset the sensors and corresponding data read out elements for different circuits. The offset required is dependent upon a number of factors, including the number of layers in the device. For the example of a 50 layer device, with an inter-layer spacing of 20 nm, the distance from the electronic circuit to the uppermost magnetic circuit is approximately 1 µm. The field strength generated by the generators therefore needs to be sufficient to have effect at this distance from the electronic circuit. It is generally the case that a magnetic field generated by an electronic or electrical circuit extends equally in all directions. Thus, in order to avoid interference between the different generators and sensors and magnetic circuits other than their corresponding magnetic circuit, an offset equal to at least approximately twice the maximum effect radius is generally advisable. In some circumstances a lower offset may be achieved if the power of each generator/sensor is specifically tailored to the layer in which it has to write/read data. In some examples of a 50 layer device, a spacing in the region of 5 to 10 µm can be used to provide a balance between non-interference and circuit density. Higher offsets may be used in other examples.

Formed in layers above the silicon substrate 50 are a number of magnetic circuit layers 40, each having formed therein one or more magnetic circuits 42, and being separated by a dielectric layer 41. Each magnetic circuit 42 includes a write element 33 and a reading element 34. For each magnetic circuit in the device, the write element 33 and reading element 34 are located directly above a magnetic field generator and a magnetic field sensor of the electrical circuit layer 50 respectively. In order to enable each magnetic circuit to be written to and read from individually, each magnetic circuit has a write element 33 and reading element 34 which do not overlap either the write element of the reading element of any other magnetic circuit.

This relative alignment of magnetic circuit elements against the electronic circuit elements is further illustrated in FIG. 9 which represents a plan through of the device looking through the magnetic circuit layers 40 onto the electrical circuit layer 50. As can be seen from FIG. 9, a magnetic circuit 42a (shown in solid line) on a first magnetic circuit layer has a writing element 33a which aligns with a magnetic filed generator 52a of the electrical circuit, and a reading element 34a which aligns with a magnetic field sensor 53a of the electrical circuit. Similarly, a magnetic circuit 42b (shown in dashed line) on a second magnetic circuit layer has a writing element 33b which aligns with a magnetic filed generator 52b of the electrical circuit, and a reading element 34b which aligns with a magnetic field sensor 53b of the electrical circuit. Thus multiple layers of magnetic circuits can be arranged over the same region of the electrical circuit, provided that the reading and writing portions of the magnetic circuits are offset from one another.

Thereby, the magnetic field generators of the electrical circuit can be activated individually to locally alter the rotating magnetic filed which is applied to the entire device. By this means, a single rotating magnetic field can be applied to the entire device and local alteration of the magnetic field be performed to allow data to be written to selected ones of the magnetic circuits 42. Likewise, when it is desired to read information from a given magnetic circuit, the magnetic field sensor corresponding to the reading element 34 for that circuit can be activated to read the data from the magnetic circuit into the electrical circuit.

The selective erase function described above with reference to FIG. 6, can also be applied to a multi-layer device such as that shown in any of FIGS. 7, 8 or 9. This can be applied globally to all circuits or can be performed locally on a per circuit or group of circuits basis. In a situation where multiple circuits are driven by a common rotating magnetic field, the altered drive field for the selective erase can be effected locally, so as not to have to erase data from all circuits within the field. When an erase is desired, the drive signal; to cause deletion is applied to the entire device. However, for circuits where no deletion is required, an appropriately located electrical circuit element on the electrical circuit layer can be activated to "top-up" the magnetic field for those circuits so as to ensure that the domain walls propagate normally around the circuit. Alternatively, such deletions can be handled by stopping the drive field and using an appropriately aligned electrical circuit element on the electrical circuit substrate 50 to provide the part-strength drive signal to the clear end of the circuit to move the domain wall.

Thus, there has now been described an example of a multi-layer magnetic memory device which enables multiple layers of magnetic memory circuits to be written to and read from using a single electrical circuit layer. Thus a production cost for the device can be kept low as there is no need to create direct electrical connections to each magnetic circuit layer.

By adopting such a strategy of having multiple layers, each having multiple data storage circuits a very high storage density can be achieved. For example, using the circuit component sizes used in the example of FIG. 4 above, and assuming fifty magnetic circuit layers in the device, a data density of up to 16 Gbit/inch$^2$ (approximately 25.4 Mbit/mm$^2$ using a conversion of 1 mm$^2$=0.00155 inch$^2$). If the magnetic circuit tracks are reduced in width to 90 nm (and the radius of curvature correspondingly reduced to 450 nm), then this data density can be increased to 77 Gbit/inch$^2$ (122 Mbit/mm$^2$). This it can be seen that very high capacity memory devices can be created using a small physical device.

Although it has been described above that a multi-layer device can be fabricated by depositing the layers for the magnetic circuit onto the substrate where the electronic circuit has already been created, other manufacture techniques could be used. For example, in order to avoid a necessity for introducing magnetic materials into an electronic circuit manufacturing facility, the electronic circuit substrate and multiple magnetic circuit layers can be manufactured separately and assembled into a single device. Thus the electronic circuit can be formed on a silicon (or other semiconductor) substrate as is conventionally known. In a separate manufacture process, the magnetic circuit layers can be fabricated based upon a substrate, such as a silicon or other semiconductor substrate as described above. In this process, the layer closest to the substrate will end up as the layer furthest from the electronic circuit. Following manufacture of these two portions, they can be assembled such that the substrate of the magnetic circuit layers is distal the substrate of the electronic circuit. The assembly of the two portions can be achieved using any suitable fixing method. In one example a mechanical fixing method which applies pressure to the two substrates causing them to be forced together can be used. In another example a fixing method based upon creating a vacuum between the two portions to hold them together by suction can be used. Thus it can be seen that a variety of manufacture methods can be used to created a multi-layer magnetic circuit device.

Figure 10:
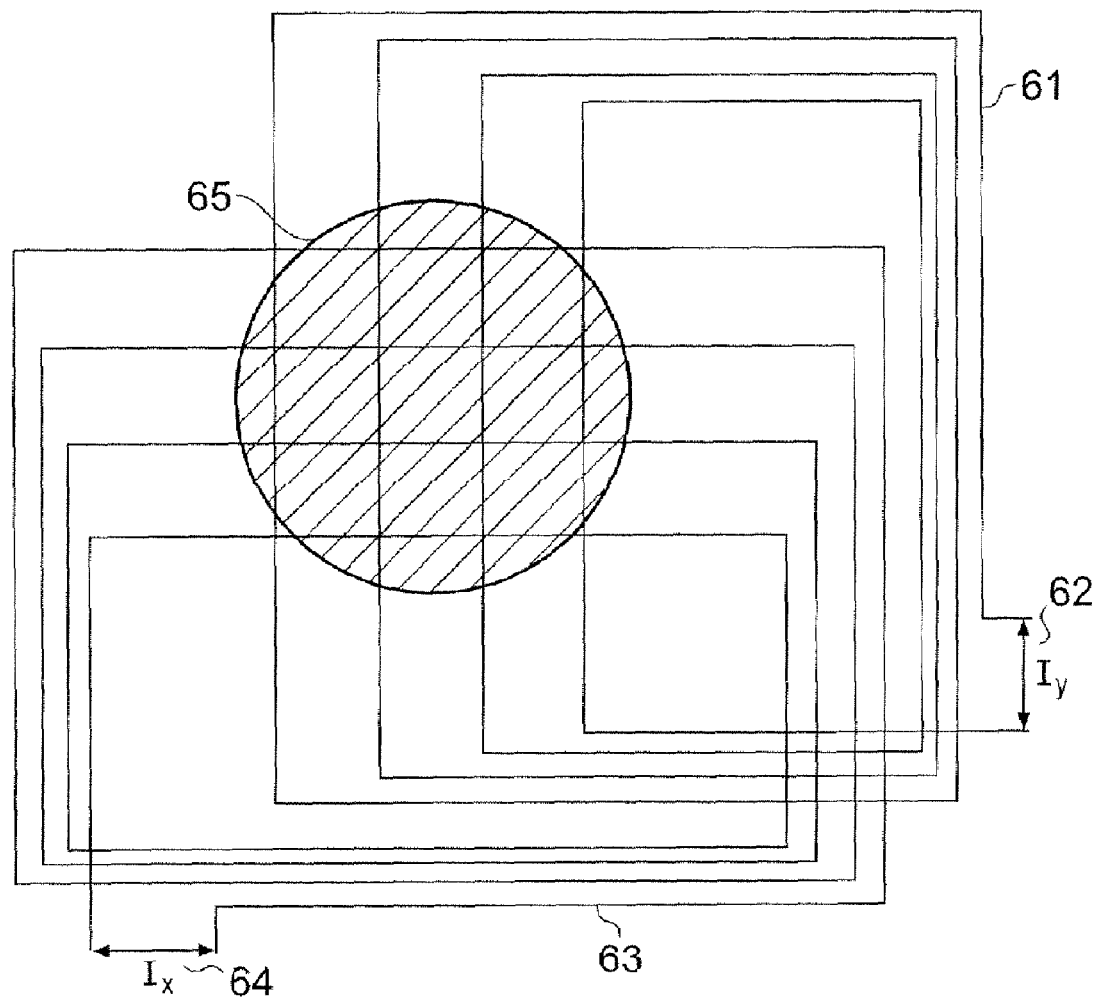
FIG. 10 shows a schematic view of a rotating magnetic field generator.

Now, with reference to FIG. 10, there will be shown an example of a structure for generating the rotating magnetic field. In this structure, a pair of coils 61 and 63 are arranged in a cross configuration, with the tracks of the respective coils crossing substantially orthogonally. Thus by applying an alternating signal to the coils, a rotating magnetic field can be created. In the present example, driving coil 61 with a cosine wave shaped signal Iy at 62, and driving coil 63 with a sine wave shaped signal Ix at 64 will result in a rotating magnetic field at the portion where the coils cross. The relative phase of the sine and cosine signals determines the direction of rotation of the field. Thus, magnetic circuits placed in a volume perpendicular to the indicated area 65 will be driven by the generated rotating magnetic filed. As shown in FIG. 9, the portions of the coils which do not form a part of the cross-over region can be compacted spatially to reduce the overall size of the field generating circuit.

As will be appreciated, alternative methods for generation of the rotating magnetic field can be used. One alternative option is to use, for example, strip lines on the electronic circuit substrate to generate the rotating field. These can be driven using sine and cosine waves as discussed above. Such strip line based signal generation can be used to generate a rotating magnetic field for the whole device. In other examples, multiple field generator arrangements can be used to create different rotating fields for different regions of the device. Thus different areas of the device can be driven at different frequencies and/or accessed asynchronously. The areas driven by the different rotating field generators can encompass more than one circuit in each layer, one circuit in each layer, or only a single circuit in a single layer. In this last example, the rotating field generator can be used to perform the writing of data to the circuit by direct modulation of the rotating field rather than by applying a separate local generator for field modulation for writing.

By implementing a device with a number of magnetic circuits within a rotating magnetic field such as that generated by the circuit shown in FIG. 10, and by driving many magnetic circuits in many layers from a single electrical circuit as discussed above with reference to FIGS. 7 to 9, it is possible to create a device where all heat-creating elements are located at the periphery of the device, and where the core regions of the device create very little waste heat. Thus a magnetic circuit device created in accordance with these principals can operate without danger of overheating due to insufficient cooling provision. In most applications, a device fabricated in this manner can be operated continuously without any need for active cooling.

Thus there has now been described a system, apparatus and method for creating a magnetic circuit device which can be driven, written to and read from remotely. Thus a high density data storage device can be created using magnetic circuit elements having no direct electrical connection to reading and writing circuits for the device. Also, data can be selectively deleted from the device without a direct electrical connection between the erase circuit and the magnetic circuit. Thus a manufacturing cost for the device can be maintained low due to the lack of electrical connections required. Also, a device using such magnetic circuits can be made small and still provide a high number of logic gates.

Alternative circuit configurations which can be used to make magnetic circuits suitable for use in a magnetic device as outlined above will now be described with reference to FIGS. 11 to 14.

Figure 11:
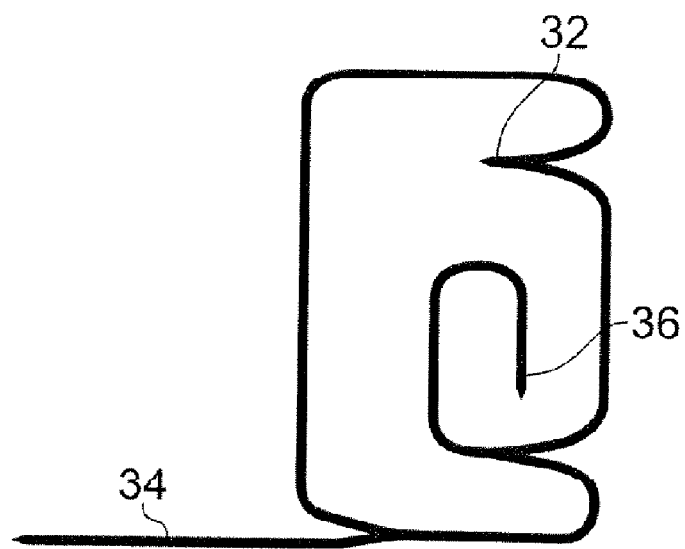
FIG. 11 shows a schematic view of a magnetic memory circuit.

FIG. 11 shows a simple (2-bit) shift register using a curved stub end of a NOT gate to provide a data writing capability. This arrangement requires the use of both clockwise and anti-clockwise (counter-clockwise) field rotations. As will be appreciated, changing the direction of rotation of the drive field is a matter of altering the relative phase of the horizontal and vertical components of the drive signal. For this structure, the read operation will use a clockwise rotating field to propagate a domain wall into the fan-out element 34 for reading. When a domain wall arrives at the NOT gate with the attached data input element 36, it will split in two. One part will propagate through the output wire and continue through the shift register. The other part will propagate along the central stub of the NOT gate and around the (clockwise) corners before reaching the data input element 36. Here the domain wall either annihilates at the stub end, or simply becomes stuck as it cannot escape to propagate back into the circuit such that the data writing element functions as a domain wall black hole.

For writing an anti-clockwise (counter-clockwise) field is used in order to propagate domain walls out of the data writing element 36 and into the NOT gate to which it is attached. When a data bit is to be written, the vertical filed amplitude is increased above the "writing threshold" value for a full field-cycle, nucleating two domain walls. When the first domain wall reaches the NOT gate junction, it will divide along the NOT gate input and output wires. The domain wall that propagates around an anti-clockwise corner continues to travel around the shift register. The other domain wall travels to the first corner, which has clockwise rotation, before travelling back into the NOT gate. This domain wall then meets the second nucleating domain wall to annihilate. If the second domain wall were not created, the "returning" part of the first domain wall would oscillate in the NOT gate central stub and fill the shift register with domain walls.

Figure 12:
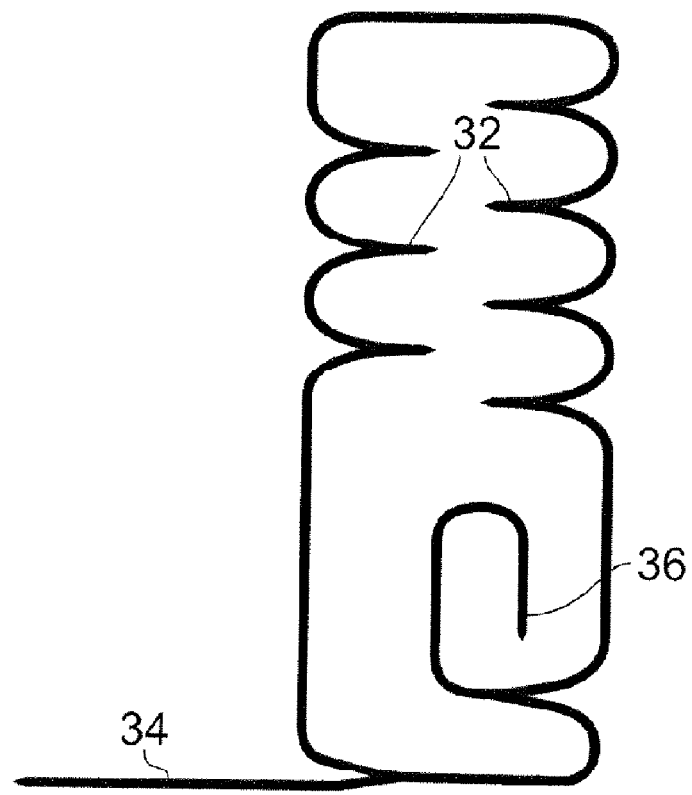
FIG. 12 shows a schematic view of a magnetic memory circuit.

A more complex version of this arrangement (5-bit) is shown in FIG. 12. This operates in the same way as the simple arrangement shown in FIG. 11. These circuits can be used with the selective erase function described with reference to FIG. 6 above.

Thus there has now been described an example of an alternative magnetic shift register configuration which uses a bi-directional drive field. This arrangement can be driven, written to, read from and deleted from using electrical circuitry not directly connected to the magnetic circuit and can be created in a multi-layer device having more than one magnetic circuit element per layer.

Figure 13:
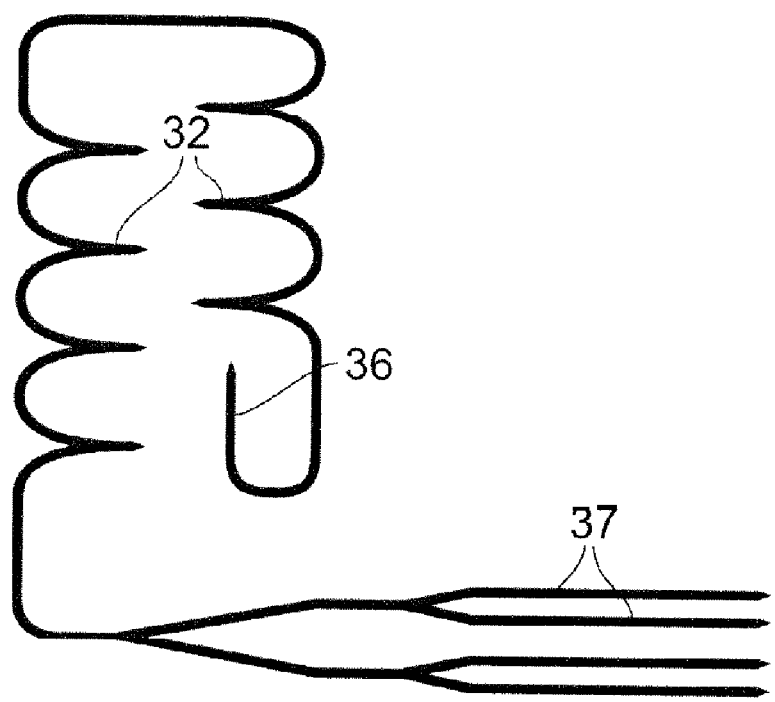
FIG. 13 shows a schematic view of a magnetic open shift register circuit.

With reference to FIG. 13, there will now be described an example of a 7-gate serial shift register. As the data input element 36 is a part of the shift register, this example device is a 5-bit device. The multiple fan out part 37 allows each domain wall to be read more than once despite the destructive data read-out of this device. As shown, the domain walls can be read in four places simultaneously. This effectively provides output amplification at a factor of ×4. Thus signal to noise ratio of data read-out can be increased. Such a multiple fan-out arrangement for data reading is not limited to use in a destructive data read-out circuit and can be applied to any magnetic circuit.

As the shift register of this example is open rather than looped, it operates principally as a delay circuit, delaying the data written in at the writing element 36 by 5 bit periods before being read out at the read portion 37.

Figure 14:
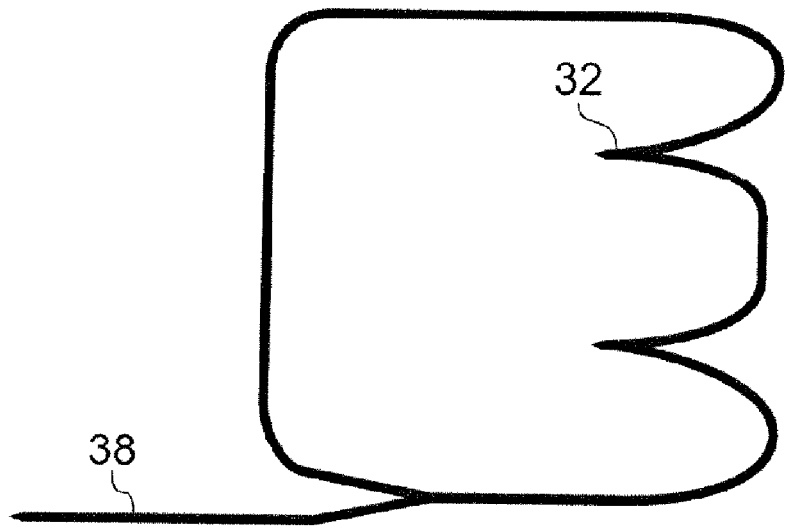
FIG. 14 shoes a schematic view of a magnetic memory circuit.

FIG. 14 shows an example shift register where the data input is connected via a fan-out. Here, the data input element 38 is introduced via the fan-out element and is not attached to a NOT-gate. It is shown in this example with a 'horizontal' data input element but suitable corners would allow the 'vertical' equivalent to be used. This device uses both clockwise and anti-clockwise drive field directions. In read mode, domain walls are propagated around the loop in a clockwise direction. A domain wall incident on the fan-out will divide into two, with one part continuing around the loop and the other travelling along the fan-out arm (to enable reading by remote field sensor) before annihilating at the end of the data input element 38. Write mode would use an anti-clockwise field rotation. A domain wall arriving at the fan-out junction from the data input element 38 should split and initially travel in opposite directions in the main loop (thus the fan-out junction effectively acts as a NOT-gate in this mode). One domain wall continues around the loop while the other will meet a clockwise-turning corner and return to the fan-out junction. As it propagates through the fan-out, one domain wall will continue in the loop, creating the second of two domain walls input to the device, while the other will travel along the data input element arm. For a 'horizontal' element, this domain wall will annihilate. For a 'vertical' element, nucleation of a second domain wall will be necessary as described with reference to FIG. 11 to avoid an oscillation condition.

This arrangement provides an advantage in device density as no space inside the NOT-gate loop is used up to accommodate the input element. While the input element itself occupies a relatively small area, any increase in the width of the main shift register loop to accommodate the input element must be continued for the whole length of the loop. With interdigitation of opposite NOT-gates, removing the data input element from inside the shift register loop could make a factor of two difference to device density.

Thus there have now been described examples of alternative arrangements for magnetic circuit shift registers, using both singe and bi-directional drive fields, all of which can be driven, written to and read from without a direct electrical connection to the magnetic circuit. In some examples, the circuits can also be selectively deleted from without a direct electrical connection to the magnetic circuit.

Examples of further circuit elements and configurations which can be used to make magnetic circuits suitable for use in a magnetic device as outlined above will now be described with reference to FIGS. 15 and 16.

FIG. 15A shows a magnetic logic circuit comprising a NOT-gate cusp 71, a fan-out junction 72 and a cross-over junction 73. The entire circuit is placed in a rotating magnetic field (anti-clockwise rotating in this example). The NOT-gate is fabricated in a loop structure such that at least one domain wall will exist in the loop and to enable easy experimental testing. However, in the circuit of the present example, a domain wall propagating around the loop in FIG. 15A must also pass through a cross-over structure, as indicated schematically in FIG. 15B. To obtain a well-defined starting state of a single domain wall before measurement, the device magnetisation is first saturated in a large (>200 Oe (15920 A/m)) magnetic field before adjacent pairs of domain walls are annihilated using a low-amplitude rotating field. Due to the synchronous nature of the logic device, circuit geometry defines the domain wall propagation time around the NOT-gate/loop to be ½ field-cycle through the NOT-gate and 1 field-cycle for each 360° loop. Hence, a single domain wall round trip takes 5/2 field-cycles, leading to a 5-field-cycle magnetisation switching period. The fan-out element forms part of this loop but does not affect the domain wall round-trip time. One fan-out output feeds back into the loop while the other extends into a long arm to provide a read-out element to enable monitoring of the loop magnetisation.

Figure 15:
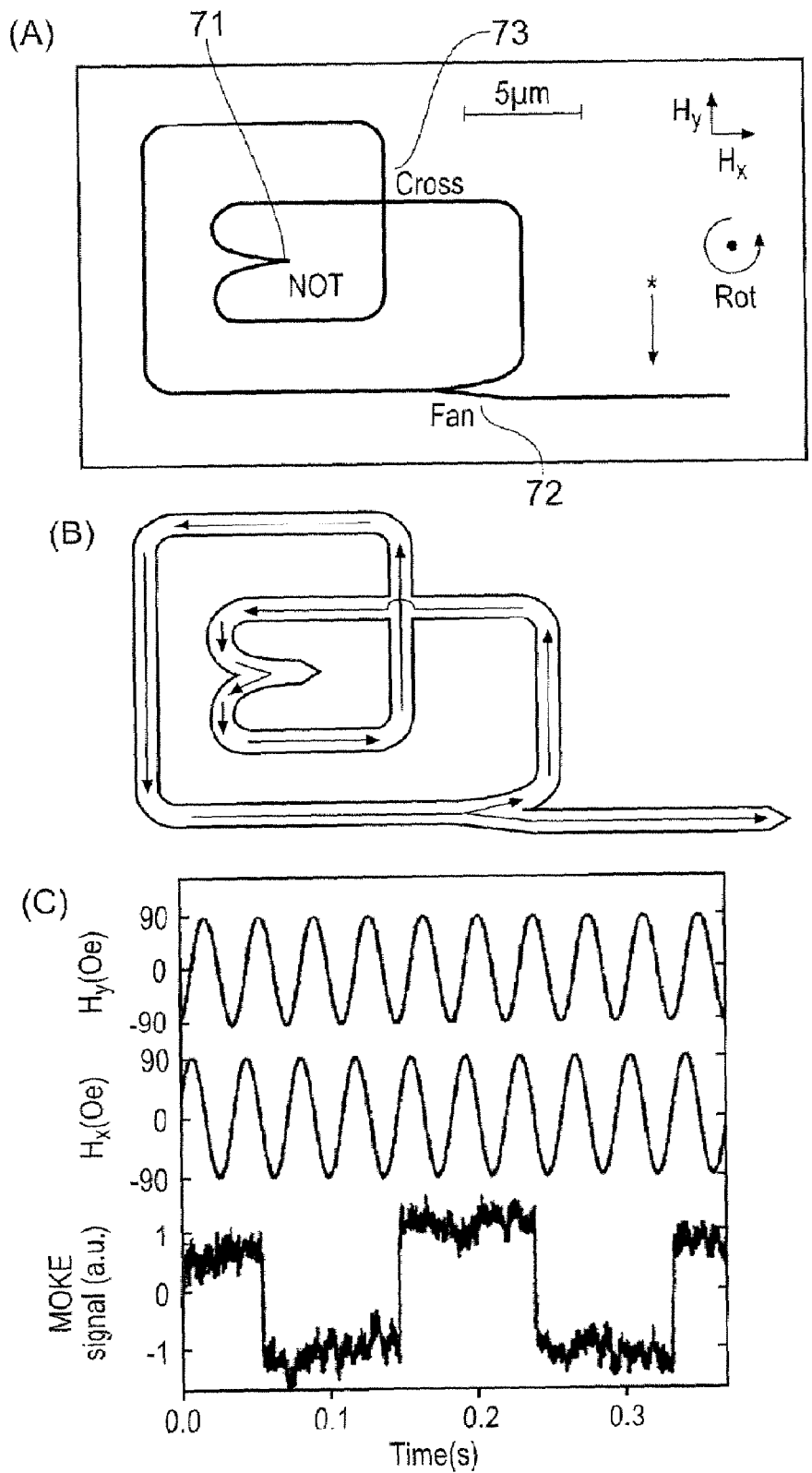
FIGS. 15A to 15C show the operation of a multi-element magnetic circuit.
Figure 16:
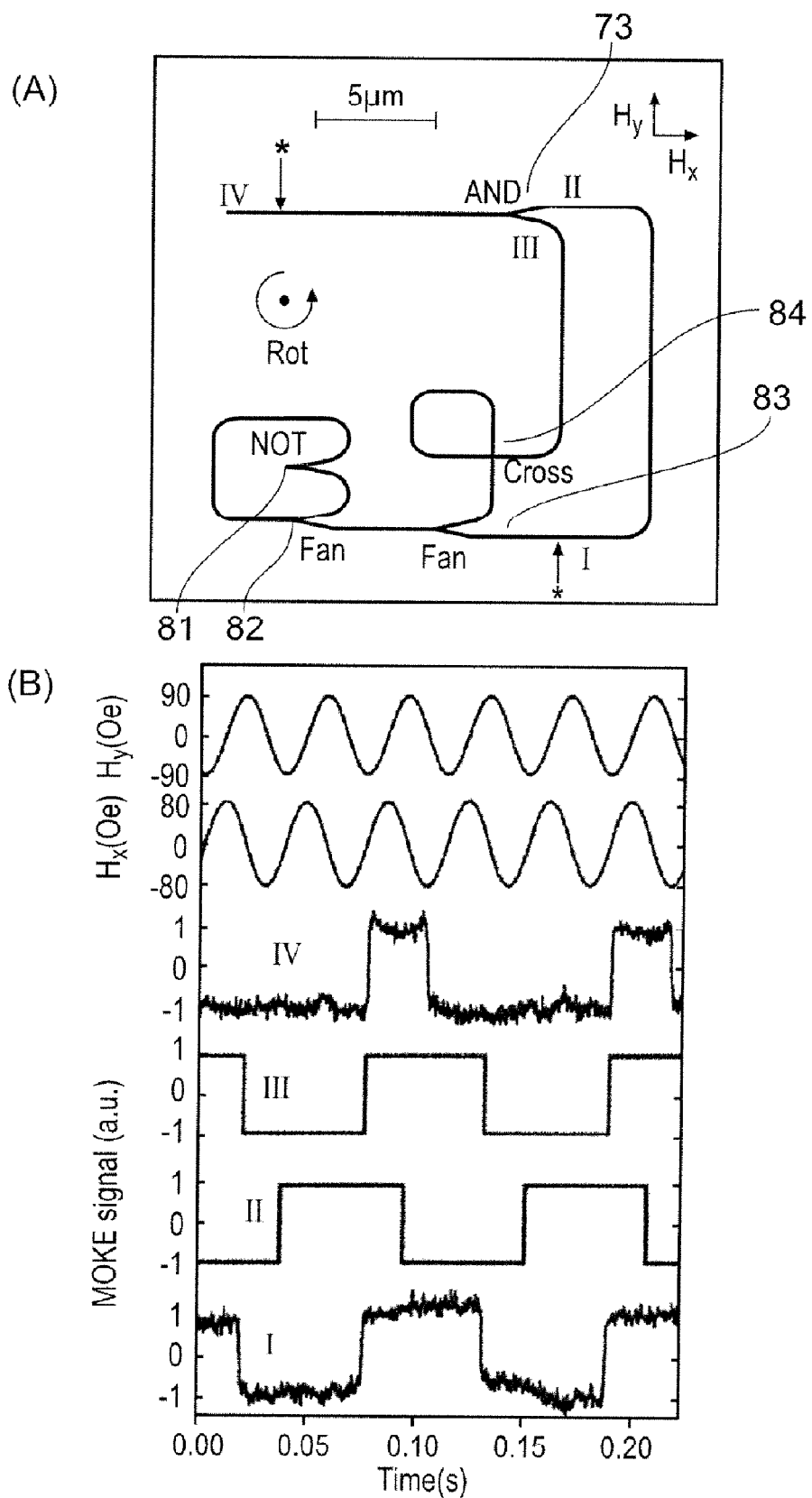
FIGS. 16A and 16B show the operation of a multi-element magnetic circuit.

Within a suitable counter-clockwise rotating field, magneto-optical Kerr effect (MOKE) magnetometry measurement from position "*" in FIG. 15A indicates a switching period of 5/2 field-cycles (FIG. 15C), confirming that the NOT-gate, fan-out and cross-over elements are working correctly. Thus the circuit of FIG. 15 provides a simple looping inversion, maintaining logical "1" and "0" states in alternation for 5/2 field cycles at a time.

Of the four logic architecture elements (NOT, AND, fan-out, and cross-over), the cross-over junction can be the most challenging to achieve as its operation can be sensitive to the nanowire dimensions at the junction.

To pass across the cross-over element 73, a domain wall must expand fully across the junction, an energetically costly process, before being able to propagate further along the output wire. However, domain walls must not be allowed to propagate along the orthogonal wire direction, or else the digital information in the structure will have been altered. In contrast, a domain wall propagating through a fan-out junction will gradually expand from the input wire as the junction widens before dividing into two separate walls once the output wires are reached. In the present example where a 200 nm width magnetic wire is used to form the tracks, the cross-over has the following dimensions. For a distance of 500 nm either side of the junction in all four directions, the track is narrowed to 183 nm width. The tracks also meet substantially orthogonally, so as to ensure that the junction functions as s crossover rather than a fan-out. Further details of how a cross-over junction may be formed can be found in WO02/41492.

The integration of all four logic elements is completed in the nanowire network shown in FIG. 16A, consisting of a NOT-gate, an AND-gate, two fan-out junctions and one cross-over junction. Previous work (C. C. Faulkner et al., *IEEE Trans. Magn.* 39, 2860 (2003) and WO02/41492) has shown that the switching field of the AND-gate output wire depends on whether neither, one, or both of the input wires contains a domain wall, with the switching field reducing with an increasing number of incident domain walls. In order to achieve logical AND functionality, the AND-gate is operated within an elliptical rotating field with a DC field bias $H_x^{DC}$. This is similar to how previous pseudo-AND operations have been achieved in other single-layer magnetic systems (R. P. Cowburn, M. E. Welland, *Science* 287, 1466 (2000) and D. A. Allwood et al., *Appl. Phys. Lett.* 81, 4005 (2002)). The remainder of the magnetic circuit in FIG. 16A is designed to sequentially supply the AND-gate with all four possible logical input combinations for a two-input device. However, all wire junctions must be able to tolerate the DC field bias, since this is applied globally.

A NOT-gate 81 within a feedback loop is used as a signal generator for the rest of the network (providing alternate logical "1" and "0" signals via the fan-out 82). This NOT gate 81 has a 3-field-cycle switching period as three cycles are required to propagate a domain wall around the loop. This feedback loop thus feeds domain walls out of the loop and to a second successive fan-out element 83, where the domain walls are divided into two paths again. MOKE measurement at position I in FIG. 16A indicates a switching period of 3 field-cycles (FIG. 16B, trace I), confirming that the NOT-gate 81 and sequential fan-out elements 82, 83 are working correctly. Between positions I and II (FIG. 16A), we the domain walls will be delayed by ½-field-cycle as this is the amount of a full cycle required to propagate the domain walls through that circuit portion (see FIG. 16B, trace II). However, for domain walls from the second fan-out junction to reach position III, they must pass through an additional loop created by the inclusion of the cross-over junction 84 which provides a propagation delay of one field cycle in this domain wall path. The magnetisation at position III, therefore, will be delayed by 1 field-cycle compared with that at position II (FIG. 16B, trace III). The magnetisation direction at positions II and III determines the logical input state of the AND-gate 85. The logical definition of an AND-gate is that it has an output value of '1' only when both inputs are '1', and an output of '0' for all other conditions. Measurement of position IV of the magnetic circuit (FIG. 16B, trace IV) shows this to be the case (using the convention here that a high MOKE signal refers to logical '1'), demonstrating that the AND-gate is operating correctly together with the other three element types.

Thus there have now been described example circuits made from circuit elements which can be combined in different combinations to create magnetic circuits operable to carry out complex logical functions. The data writing elements described with reference to FIGS. 3, 4 and 5 can be used with any of these more complex logic functions to enable active data input into a logical circuit. Thus complex logical functions can be carried out using magnetic circuits in a multi-layer device driven, written to and read from using an electrical circuit having no electrical connections to the magnetic circuits.

The energy dissipated in each domain wall logic element must, on very general thermodynamic grounds, be less than $2M_sH_aV$ per gate output transition, where $M_s$ is the saturation magnetisation of the magnetic material (800 emu cm$^{-3}$ for Permalloy, where 1 emu=$10^{-3}$ Am$^2$), $H_a$ is the amplitude of the externally applied magnetic field and V is the volume of magnetic material switching in the gate and its output nanowire. For the experimental devices described in this paper, typical values for the energy per operation are $10^{-5}$ pJ (2000 $k_BT$ at room temperature, where $K_B$ is Boltzmann's constant and T is temperature), compared with the typical energy per gate of CMOS of $10^{-2}$ pJ for a 200 nm minimum feature size. This could allow large 3-dimensional domain wall logic circuits to operate without overheating. It is noted that domain wall logic will not necessarily be a low power consumption technology, since there can be considerable inefficiencies in generating magnetic fields. Absolute power consumption might be kept low by using small area (few hundred µm$^2$) domain wall-CMOS hybrid devices with strip lines for local field generation. However, domain wall propagation by spin transfer may ultimately overcome these inefficiencies altogether.

The future scaling performance of domain wall logic depends upon the interplay between thermodynamic stability and the required magnitude of the externally applied field. Both of these depend upon F, the width of the nanowires which form the logic elements. If the width and thickness of the nanowires are scaled together, then the shape anisotropy remains unchanged. To first order, the strength of the externally applied magnetic field required to overcome fabricational edge roughness and discontinuities at the logic elements therefore remains constant. In this case, the energy per gate transition scales with the volume of magnetic material, proportional to F$^3$. Thus, at F=70 nm a 1.8 nm thick magnetic logic device should dissipate 3×10$^{-7}$ pJ (70 kBT at room temperature), which is the lower limit for thermodynamic stability. For further reductions in F, the device thickness should be increased by scaling with F$^{-1/2}$ in order to keep the energy per gate transition unchanged. This will cause shape anisotropy to increase and hence the required externally applied field for domain wall propagation through wires and the structural discontinuities associated with wire junctions. As with MRAM, the ultimate limit of scaling will be when the required externally applied field becomes impracticably large.

A particular feature of some of the above examples is that one is not limited to a 2-dimensional plane in placing circuits. Unlike compact disc, magnetic tape and magnetic hard disc storage no mechanical or access is required to the surface of the circuit. Also, unlike electronic circuits, no electrical access is required to the surface of the circuit. Substrates may be placed on top of each other to form a 3-dimensional logical structure. This has the advantage of allowing much higher circuit densities to be achieved. In the case of data storage circuits, it is therefore possible to achieve very high data storage densities. If desired, all of the substrates in a structure may share the same applied rotating magnetic field, thus keeping the layers in synchronisation with each other and reducing the complexity of the device. The circuits may be configured to input/output a single serial stream of data, or if desired, streams of data words of multiple bit width may stored by using several rings or layers in parallel.

Memory devices based upon magnetic shift registers as described above can be used for a great many applications. As will be appreciated, the access time to data stored in such a device is dependent upon the size of each shift register (i.e. the bit address latency) and the clock speed of the rotating drive field. Different access time memories can be suited to different purposes. For example, a low access time memory could perform the functions normally associated with a hard disk drive, thus eliminating mechanical reliability issues from mass data and program storage within a computer.

Higher access time memories could be used for, for example, temporary storage of digital music for pocket digital audio players such as MP3 players (this application requires low-cost, non-volatile, re-writable storage of digital information which is usually replayed serially), temporary storage of digital photographs in digital cameras (this function is accomplished currently by FLASH electronic memory, which is expensive and which has a limited number of re-write cycles), non-volatile offline storage for mobile phones, personal organisers, palm top computers and SMART cards.

One attractive feature of domain wall logic as used in the above described circuits and devices is its great simplicity. Logical NAND is achieved in CMOS using three transistors whereas domain wall logic uses two elements (NOT and AND). A logical AND function, usually requiring six CMOS transistors, can be achieved simply by bringing two magnetic nanowires together. The fact that, unlike Silicon CMOS architecture, a domain wall cross-over junction can be achieved in a single plane and without multilevel metallisation means that, in principle, extremely low cost devices could be produced. While most applications of magnetic logic (and indeed the wider field of spintronics) will involve a hybrid system-on-chip that includes silicon-based CMOS, certain applications such as bio-medical implants or wearable computing hardware would benefit from the ability to fabricate devices on, for example, flexible polyimide substrates. One could imagine nanowires constructed into 3-dimensional neural networks or hugely dense 3-dimensional non-volatile memories. The ability to supply power, clock, master reset and serial input all via a single externally applied magnetic field, as demonstrated in FIG. 4, is particularly attractive in the 3-dimensional case, where signal access is limited. There may also be potential for interfacing domain wall logic with emerging dilute ferromagnetic semiconductors that allow electrical control and sensing of magnetisation.

Although the embodiments above have been described in considerable detail, numerous variations and modifications will become apparent to those skilled in the art once the above disclosure is fully appreciated. It is intended that the following claims be interpreted to embrace all such variations and modifications as well as their equivalents.

The invention claimed is:

1. A magnetic logic device comprising:
   a generally planar first substrate for an electrical circuit;
   a plurality of generally planar second substrates for a magnetic circuit, formed in a stacked arrangement over the first substrate;
   each said second substrate having formed thereon a magnetic circuit;
   each magnetic circuit having a plurality of logic elements, a data writing element and a data reading element;
   wherein the data writing element of each magnetic circuit corresponds in planar positioning to a respective magneto-electrical writing element of the first substrate;
   wherein the data reading element of each magnetic circuit corresponds in planar positioning to a respective magneto-electrical reading element of the first substrate; and
   wherein the data writing element and data reading element of a magnetic circuit in a first second substrate are offset from the data writing element and data reading element of a magnetic circuit in a second second substrate.

2. The magnetic logic device of claim 1, wherein the magnetic logic elements comprise at least one data storage element.

3. The magnetic logic device of claim 1, wherein the second substrates are separated by a non-ferromagnetic layer.

4. The magnetic logic device of claim 3, wherein the non-ferromagnetic layer comprises a material selected from the group comprising a dielectric material, a polymer material and a non-ferromagnetic metal material.

5. The method of claim 4, wherein the magnetic circuit is not electrically connected to a source of the field modulation.

6. The magnetic logic device of claim 1, wherein each said second substrate has formed thereon a plurality of magnetic circuits.

7. The magnetic logic device claim 1, wherein the magnetic circuit is formed from nanowires of magnetic material.

8. The magnetic logic device of claim 7, wherein each logic element is formed from a join between nanowires.

9. The magnetic logic device of claim 1, wherein the data writing element and the data reading element are a physical single element.

10. The magnetic logic device of claim 1, further comprising a magnetic field generator for generating a rotating magnetic field for driving the magnetic circuits.

11. The magnetic logic device of claim 1, wherein the data writing element comprises an enlarged stub end of a logical NOT gate.

12. The magnetic logic device of claim 11, wherein the magnetic field generator is operable to generate a magnetic field in a clockwise and/or an anti-clockwise direction.

13. The magnetic logic device of claim 1, wherein the data writing element comprises a circuit portion with a coercivity lower than that of an adjacent circuit portion.

14. The magnetic logic device of claim 13, wherein the circuit portion with a coercivity lower than that of an adjacent circuit portion is formed having a different geometry to the adjacent circuit portion.

15. The magnetic logic device of claim 1, wherein the magnetic circuit further comprises an erasure portion.

16. The magnetic logic device of claim 15, wherein the erasure portion corresponds in planar positioning to a respective electrical erasing portion of the first substrate.

17. The magnetic logic device of claim 1, wherein the writing portion and reading portion of a magnetic circuit in a first second substrate are offset from the writing portion and reading portion of a magnetic circuit in a second second substrate.

18. The magnetic logic device of claim 1, wherein the magnetic properties of the v magnetic circuit are dependent upon the physical geometry of the circuit.

19. A data storage device comprising a magnetic logic device comprising:
   a generally planar first substrate for an electrical circuit;
   a plurality of generally planar second substrates for a magnetic circuit, formed in a stacked arrangement over the first substrate;

each said second substrate having formed thereon a magnetic circuit;

each magnetic circuit having a plurality of logic elements, a data writing element and a data reading element;

wherein the data writing element of each magnetic circuit corresponds in planar positioning to a respective magneto-electrical writing element of the first substrate;

wherein the data reading element of each magnetic circuit corresponds in planar positioning to a respective magneto-electrical reading element of the first substrate; and wherein the data writing element and data reading element of a magnetic circuit in a first substrate are offset from the data writing element and data reading element of a magnetic circuit in a second substrate.

20. A magnetic circuit device comprising:

a plurality of generally planar substrates formed in a stacked arrangement, each said substrate having formed thereon a magnetic circuit;

each magnetic circuit having a plurality of logic elements, a data writing element and a data reading element;

wherein the data writing element of each magnetic circuit corresponds in planar positioning to an anticipated position of a respective magneto-electrical writing element;

wherein the data reading element of each magnetic circuit corresponds in planar positioning to an anticipated position of a respective magneto-electrical reading element; and wherein the data writing element and data reading element of a magnetic circuit in a first substrate are offset from the data writing element and data reading element of a magnetic circuit in a second substrate.

21. The magnetic circuit device of claim 20, wherein the second substrates are separated by a non-ferromagnetic layer.

22. The magnetic circuit device of claim 20, wherein each said second has formed thereon a plurality of magnetic circuits.

23. The magnetic circuit device of claim 20, wherein the magnetic circuit is formed from nanowires of magnetic material.

24. The magnetic circuit device of claim 23, wherein the non-ferromagnetic layer comprises a material selected from the group comprising a dielectric material, a polymer material and a non-ferromagnetic metal material.

25. The magnetic circuit device of claim 20, wherein the data writing element and the data reading element are a physical single element.

26. The magnetic circuit device of claim 20, wherein each magnetic circuit is operable to be driven by a rotating magnetic field.

27. The magnetic circuit device of claim 20, wherein the data writing element comprises an enlarged stub end of a logical NOT gate.

28. The magnetic circuit device of claim 20, wherein the data writing element comprises a circuit portion with a coercivity lower than that of an adjacent circuit portion.

29. The magnetic circuit device of claim 28, wherein the circuit portion with a coercivity lower than that of an adjacent circuit portion is formed having a different geometry to the adjacent circuit portion.

30. A method of manufacturing a memory device comprising manufacturing a magnetic logic device in accordance with claim 28 and incorporating the magnetic logic device into a memory device.

31. The magnetic circuit device of claim 20, wherein the magnetic circuit further comprises an erasure portion.

32. The magnetic circuit device of claim 31, wherein the erasure portion corresponds in planar positioning to an anticipated position of a respective magneto-electrical erasing element.

33. The magnetic circuit device of claim 20, wherein the writing portion and reading portion of a magnetic circuit in a first substrate are offset from the writing portion and reading portion of a magnetic circuit in a second substrate.

34. The magnetic circuit device of claim 20, wherein the magnetic properties of the magnetic circuit are dependent upon the physical geometry of the circuit.

35. A data storage device comprising a magnetic circuit device comprising:

a plurality of generally planar substrates formed in a stacked arrangement, each said substrate having formed thereon a magnetic circuit;

each magnetic circuit having a plurality of logic elements, a data writing element and a data reading element;

wherein the data writing element of each magnetic circuit corresponds in planar positioning to an anticipated position of a respective magneto-electrical writing element;

wherein the data reading element of each magnetic circuit corresponds in planar positioning to an anticipated position of a respective magneto-electrical reading element; and wherein the data writing element and data reading element of a magnetic circuit in a first substrate are offset from the data writing element and data reading element of a magnetic circuit in a second substrate.

36. A method for manufacturing a magnetic logic device, the method comprising:

forming an electrical circuit on a first substrate, the electrical circuit comprising a plurality of magneto-electric writing elements and reading elements;

forming a plurality of generally planar second substrates in a stacked arrangement over the first substrate, each said second substrate having formed thereon a magnetic circuit;

wherein each magnetic circuit comprises a plurality of logic elements, a data writing element and a data reading element; and wherein the data writing element of each magnetic circuit corresponds in planar positioning to a respective magneto-electrical writing element of the first substrate;

wherein the data reading element of each magnetic circuit corresponds in planar positioning to a respective magneto-electrical reading element of the first substrate; and wherein the data writing element and data reading element of a magnetic circuit in a first substrate are offset from the data writing element and data reading element of a magnetic circuit in a second substrate.

37. A method for manufacturing a magnetic logic device, the method comprising:

forming a first device portion comprising an electrical circuit on a first substrate, the electrical circuit comprising a plurality of magneto-electric writing elements and reading elements;

forming a second device portion comprising a plurality of generally planar second substrates in a stacked arrangement over a third substrate, each said second substrate having formed thereon a magnetic circuit comprising plurality of logic elements, a data writing element and a data reading element;

attaching the first and second device portions such that the second substrates are arranged between the first and third substrates, and such that the data writing element of each magnetic circuit corresponds in planar positioning to a respective magneto-electrical writing element of the first substrate and the data reading element of each magnetic circuit corresponds in planar positioning to a respective magneto-electrical reading element of the first substrate; and wherein the data writing element and data reading element of a magnetic circuit in a first substrate are offset from the data writing element and data reading element of a magnetic circuit in a second substrate.

38. A method of manufacturing a memory device comprising manufacturing a magnetic logic device in accordance with claim 36 or 37 and incorporating the magnetic logic device into a memory device.

39. A method for writing data to a magnetic circuit formed on a generally planar substrate operable to be arranged in a stacked arrangement with other such substrates, the magnetic circuit having a plurality of logic elements, a data writing element and a data reading element, wherein the data writing element of the magnetic circuit corresponds in planar positioning to an anticipated position of a respective magneto-electrical writing element and is offset from an anticipated position of a data writing element of a magnetic circuit formed in another substrate, and wherein the data reading element of each magnetic circuit corresponds in planar positioning to an anticipated position of a respective magneto-electrical reading element and is offset from an anticipated position of data reading portion of a magnetic circuit formed in another substrate, the method comprising:

locating the magnetic circuit in a rotating magnetic field; and modulating the rotating magnetic field in at least the location of a data writing element of the magnetic circuit.

40. The method of claim 39, wherein the data writing element comprises a circuit portion with a coercivity lower than that of an adjacent circuit portion.

41. The method of claim 39, wherein the magnetic circuit is not electrically connected to a source of the field modulation.

42. A method for writing data to a magnetic circuit, the magnetic circuit being a plurality of logic elements, a data writing element and a data reading element the method comprising:

locating the magnetic circuit in a rotating magnetic field; and modulating the rotating magnetic field in at least the location of a data writing element of the magnetic circuit, which data writing element comprises a circuit portion with a coercivity lower than that of an adjacent circuit portion.

* * * * *